US007635865B2

(12) United States Patent
Suzawa et al.

(10) Patent No.: US 7,635,865 B2
(45) Date of Patent: Dec. 22, 2009

(54) WIRING AND MANUFACTURING METHOD THEREOF, SEMICONDUCTOR DEVICE COMPRISING SAID WIRING, AND DRY ETCHING METHOD

(75) Inventors: Hideomi Suzawa, Kanagawa (JP); Koji Ono, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 334 days.

(21) Appl. No.: 10/902,358

(22) Filed: Jul. 29, 2004

(65) Prior Publication Data

US 2005/0056934 A1    Mar. 17, 2005

Related U.S. Application Data

(62) Division of application No. 09/615,449, filed on Jul. 13, 2000, now abandoned.

(30) Foreign Application Priority Data

Jul. 22, 1999    (JP) .................................. 11-206954

(51) Int. Cl.
    *H01L 29/76*    (2006.01)
(52) U.S. Cl. .......................................... 257/66; 257/72
(58) Field of Classification Search .................. 257/66, 257/59, 57, 72, 69, 98, 344, 412, 192, 338, 257/229, E27.1, E27.117; 438/149
    See application file for complete search history.

(56) References Cited

U.S. PATENT DOCUMENTS

| 4,233,109 A | 11/1980 | Nishizawa .................. 156/643 |
| 4,394,182 A | 7/1983 | Maddox, III |
| 4,851,363 A | 7/1989 | Troxell et al. |
| 4,885,074 A | 12/1989 | Susko et al. ................. 204/298 |
| 5,185,058 A | 2/1993 | Cathey, Jr. .................. 438/695 |
| 5,302,240 A | 4/1994 | Hori et al. ................... 438/719 |
| 5,378,309 A | 1/1995 | Rabinzohn .................. 438/695 |
| 5,470,768 A | 11/1995 | Yanai et al. ................... 437/40 |
| 5,486,717 A | 1/1996 | Kokubo et al. .............. 257/385 |
| 5,583,369 A | 12/1996 | Yamazaki et al. |
| 5,633,738 A | 5/1997 | Wakui et al. .................. 349/46 |

(Continued)

FOREIGN PATENT DOCUMENTS

| CN | 1221809 | 7/1999 |
| EP | 0 680 079 | 11/1995 |
| EP | 0 820 087 A2 | 1/1998 |
| EP | 0 909 972 | 4/1999 |
| EP | 0 917 187 A2 | 5/1999 |

OTHER PUBLICATIONS

Specification, claims as filed, abstract, drawings, Official Filing Receipt of U.S. Appl. No. 09/433,705, filed Nov. 4, 1999 (not published).

(Continued)

*Primary Examiner*—Davienne Monbleau
*Assistant Examiner*—(Vikki) Hoa B Trinh
(74) *Attorney, Agent, or Firm*—Cook Alex Ltd.

(57) ABSTRACT

A dry etching method for forming tungsten wiring having a tapered shape and having a large specific selectivity with respect to a base film is provided. If the bias power density is suitably regulated, and if desired portions of a tungsten thin film are removed using an etching gas having fluorine as its main constituent, then the tungsten wiring having a desired taper angle can be formed.

76 Claims, 16 Drawing Sheets

U.S. PATENT DOCUMENTS

| | | | | |
|---|---|---|---|---|
| 5,643,826 | A | 7/1997 | Ohtani et al. | 437/88 |
| 5,712,495 | A | 1/1998 | Suzawa | |
| 5,716,534 | A | 2/1998 | Tsuchiya et al. | 216/67 |
| 5,779,926 | A | 7/1998 | Ma et al. | |
| 5,824,606 | A | 10/1998 | Dible et al. | 438/729 |
| 5,825,437 | A | 10/1998 | Seo et al. | 349/46 |
| 5,830,787 | A | 11/1998 | Kim | |
| 5,852,481 | A | 12/1998 | Hwang | |
| 5,856,689 | A | 1/1999 | Suzawa | |
| 5,861,103 | A | 1/1999 | Yamazaki et al. | |
| 5,883,007 | A | 3/1999 | Abraham et al. | 438/714 |
| 5,895,935 | A | 4/1999 | Yamazaki et al. | |
| 5,915,204 | A | 6/1999 | Sumi | |
| 5,917,199 | A | 6/1999 | Byun et al. | 257/59 |
| 5,923,962 | A | 7/1999 | Ohtani et al. | 438/150 |
| 5,923,999 | A | 7/1999 | Balasubramanyam et al. | 438/592 |
| 5,990,542 | A | 11/1999 | Yamazaki | |
| 5,998,841 | A | 12/1999 | Suzawa | |
| 6,001,714 | A | 12/1999 | Nakajima et al. | |
| 6,030,667 | A | 2/2000 | Nakagawa et al. | |
| 6,071,821 | A | 6/2000 | Hirata et al. | |
| 6,093,457 | A | 7/2000 | Okumura et al. | |
| 6,114,736 | A | 9/2000 | Balasubramanyam et al. | |
| 6,121,652 | A | 9/2000 | Suzawa | |
| 6,130,119 | A | 10/2000 | Jinnai | 438/155 |
| 6,130,154 | A | 10/2000 | Yokoyama et al. | |
| 6,239,403 | B1 | 5/2001 | Dible et al. | 219/121.43 |
| 6,259,106 | B1 | 7/2001 | Boegli et al. | 250/492.22 |
| 6,335,290 | B1 | 1/2002 | Ishida | |
| 6,357,385 | B1 | 3/2002 | Ohmi et al. | 118/723 |
| 6,362,027 | B1 | 3/2002 | Yamazaki et al. | |
| 6,365,917 | B1 | 4/2002 | Yamazaki | 257/72 |
| 6,414,345 | B1 | 7/2002 | Suzawa | |
| 6,423,242 | B1 | 7/2002 | Kojima et al. | 216/79 |
| 6,429,086 | B1 | 8/2002 | Meikle et al. | 438/381 |
| 6,431,112 | B1 | 8/2002 | Sill et al. | 118/723 |
| 6,433,841 | B1 | 8/2002 | Murade et al. | |
| 6,462,802 | B1 | 10/2002 | Nishimura et al. | |
| 6,475,836 | B1 | 11/2002 | Suzawa et al. | 438/149 |
| 6,515,336 | B1 | 2/2003 | Suzawa et al. | 257/350 |
| 6,534,826 | B2 | 3/2003 | Yamazaki | 257/336 |
| 6,541,164 | B1 | 4/2003 | Kumar et al. | |
| 6,541,294 | B1 | 4/2003 | Yamazaki et al. | |
| 6,556,702 | B1 | 4/2003 | Rishton et al. | 382/144 |
| 6,566,684 | B1 | 5/2003 | Suzawa | |
| 6,583,471 | B1 | 6/2003 | Yamazaki et al. | |
| 6,608,353 | B2 | 8/2003 | Miyazaki et al. | 257/350 |
| 6,611,301 | B2 | 8/2003 | Murade et al. | |
| 6,646,287 | B1 | 11/2003 | Ono et al. | |
| 6,664,145 | B1 | 12/2003 | Yamazaki et al. | |
| 6,680,223 | B1 | 1/2004 | Yamazaki et al. | 438/149 |
| 6,686,228 | B2 | 2/2004 | Suzawa et al. | 438/149 |
| 6,686,606 | B2 | 2/2004 | Jeong et al. | 257/59 |
| 6,703,997 | B2 | 3/2004 | Murade | 345/92 |
| 6,709,901 | B1 | 3/2004 | Yamazaki et al. | |
| 6,737,712 | B2 | 5/2004 | Hashimoto et al. | 257/393 |
| 6,750,424 | B2 | 6/2004 | Tanaka | 219/121.75 |
| 6,753,257 | B2 | 6/2004 | Yamazaki | 438/689 |
| 6,791,630 | B2 | 9/2004 | Kim | 349/38 |
| 6,909,114 | B1 | 6/2005 | Yamazaki | |
| 6,984,551 | B2 | 1/2006 | Yamazaki et al. | |
| 7,015,141 | B2 | 3/2006 | Yamazaki | |
| 7,151,015 | B2 | 12/2006 | Suzawa et al. | |
| 7,161,178 | B2 | 1/2007 | Suzawa | |
| 7,172,928 | B2 | 2/2007 | Yamazaki | |
| 2001/0030322 | A1 | 10/2001 | Yamazaki et al. | 257/59 |
| 2001/0049197 | A1 | 12/2001 | Yamazaki et al. | 438/689 |
| 2001/0052950 | A1 | 12/2001 | Yamazaki et al. | 349/43 |
| 2001/0055841 | A1 | 12/2001 | Yamazaki et al. | 438/151 |
| 2002/0006705 | A1 | 1/2002 | Suzawa et al. | 438/279 |
| 2002/0013022 | A1 | 1/2002 | Yamazaki et al. | 438/166 |
| 2002/0016028 | A1 | 2/2002 | Arao et al. | 438/149 |
| 2002/0017685 | A1 | 2/2002 | Kasahara et al. | 257/347 |
| 2002/0110941 | A1 | 8/2002 | Yamazaki et al. | 438/25 |
| 2003/0030144 | A1 | 2/2003 | Ono et al. | |
| 2006/0051906 | A1 | 3/2006 | Yamazaki | |
| 2006/0121736 | A1 | 6/2006 | Yamazaki | |

FOREIGN PATENT DOCUMENTS

| | | |
|---|---|---|
| EP | 1 003 223 A2 | 5/2000 |
| JP | 01-207973 | 8/1989 |
| JP | 1-239844 | 9/1989 |
| JP | 04-261017 | 9/1992 |
| JP | 6-132257 | 5/1994 |
| JP | 07-130652 | 5/1995 |
| JP | 07-202047 | 8/1995 |
| JP | 07-235680 | 9/1995 |
| JP | 8-199377 | 8/1996 |
| JP | 09-055508 | 2/1997 |
| JP | H9-055508 | 2/1997 |
| JP | 9-260682 | 10/1997 |
| JP | 9-279367 | 10/1997 |
| JP | 9-293600 | 11/1997 |
| JP | 10-233511 | 9/1998 |
| JP | 10-326772 | 12/1998 |
| JP | 11-111702 | 4/1999 |
| JP | 2001-85700 | 3/2001 |
| KR | 1998-0012062 | 4/1998 |
| KR | 1999-004947 | 1/1999 |
| KR | 1999-023348 | 3/1999 |

OTHER PUBLICATIONS

El-Kareh, B., "Fundamentals of Semiconductor Processing Technologies," Kluwer Academic Publishers, p. 285, (1998).

European Search Report re application No. EP 00 11 5333, mailed Sep. 6, 2001.

Pending U.S. Appl. No. 09/619,477, filed Jul. 19, 2000, Yamazaki, including specification, claims, abstract, drawings & PTO filing receipt.

Notification of Reasons for Rejection, re Japanese patent application no. H11-206954, dated Mar. 25, 2008 (with English translation).

Chinese Office Action re application no. CN 200610099986.8, dated Apr. 11, 2008 (with English translation).

U.S. Appl. No. 12/009,520 to Suzawa et al, filed Jan. 18, 2008, including specification, claims, abstract, drawings and preliminary amendment A (w/pending claims).

Office Action re Korean patent application no. KR 2007-0046361, dated Aug. 7, 2007 (with English translation).

Office Action re Chinese patent application no. CN 200610100376.5, dated Aug. 31, 2007 (with English translation).

Bias Power: 20W

Bias Power: 30W

Bias Power: 40W

Bias Power:60W

Bias Power:100W

WIRING AND MANUFACTURING METHOD THEREOF, SEMICONDUCTOR DEVICE COMPRISING SAID WIRING, AND DRY ETCHING METHOD

CROSS REFERENCE TO RELATED APPLICATION

This application is a division of U.S. Ser. No. 09/615,449, filed on Jul. 13, 2000, which claims priority to Japanese Patent Application 11-206954, filed Jul. 22, 1999.

BACKGROUND OF THE INVENTION

1. Field of the Invention

The present invention relates to a semiconductor device having a circuit comprised of a thin film transistor (hereafter referred to as TFT), and a manufacturing method thereof. For example, the present invention relates to an electro-optical device typified by a liquid crystal display panel, and to electronic equipment in which the electro-optical device is installed as a part. In particular, the present invention relates to a dry etching method of etching a metallic thin film, and to a semiconductor device provided with a tapered shape wiring obtained by the dry etching method.

Note that throughout this specification, the term semiconductor device denotes a general device which functions by utilizing semiconductor characteristics, and that electro-optical devices, semiconductor circuits, and electronic equipments are all semiconductor devices.

2. Description of the Related Art

Techniques of structuring a thin film transistor (TFT) using a semiconductor thin film (having a thickness on the order of several nm to several hundred of nm) formed on a substrate having an insulating surface have been in the spotlight in recent years. Thin film transistors are widely applied to electronic devices such as an IC and an electro-optic device, and in particular, development of the TFT as a switching element of an image display device is proceeding rapidly.

Conventionally, Al is often used in a TFT wiring material due to things such as its ease of workability, its electrical resistivity, and its chemical resistance. However, when using Al in a TFT wiring, the formation of a protuberance such as a hillock or a whisker due to heat treatment, and the diffusion of aluminum atoms into a channel forming region, causes poor TFT operation and a reduction of TFT characteristics. High heat resistance tungsten (W), with a relatively low bulk resistivity of 5.5 $\mu\Omega \cdot cm$, can therefore be given as a preferable wiring material other than Al as a wiring material.

Further, in recent years, the demands of microfabrication techniques have become severe. In particular, with changes in high definition and large screens of a liquid crystal display, high selectivity in the wiring processing step as well as extremely strict control of line width is required.

A general wiring process can be performed by wet etching using a solution or by dry etching using a gas. However, when considering miniaturization of the wiring, maintenance of repeatability, reduction of waste, and decrease of cost, wet etching is unfavorable, and therefore dry etching is considered favorable for wiring processing.

When processing tungsten (W) by dry etching, a mixed gas of $SF_6$ and $Cl_2$ is generally used as an etching gas. While microfabrication with a large etching rate in a short time is possible when this gas mixture is used, it is difficult to obtain a desirable tapered shape. In order to improve the coverage of a lamination film formed on the wiring, there are cases in which the cross section of the wiring is made an intentional forward taper, depending upon the device structure.

SUMMARY OF THE INVENTION

An object of the present invention is to provide a method of dry etching for patterning an etching layer made from tungsten (W) or a tungsten compound so as to give the cross section a forward tapered shape. Further, another object of the present invention is to provide a method of controlling the dry etching method so as to have a uniform, arbitrary taper angle over the entire etching layer, with no dependence upon location. In addition, another object of the present invention is to provide a semiconductor device using a wiring having the arbitrary taper angle obtained from the above method, and a method of manufacturing the semiconductor device.

A structure of the present invention disclosed in this specification relating to a wiring is:

a wiring having a tungsten film, a metallic compound film having a tungsten compound as its main constituent, or a metallic alloy film having a tungsten alloy as its main constituent, characterized in that a taper angle $\alpha$ is within a range of 5° to 85°.

Further, another structure of the present invention relating to a wiring is:

a wiring having a lamination structure of laminated thin films selected from the group consisting of: a tungsten film; a metallic compound film having a tungsten compound as its main constituent; and a metallic alloy film having a tungsten alloy as its main constituent, characterized in that a taper angle $\alpha$ is within a range of 5° to 85°.

In each of the above structures, the metallic alloy film is characterized in that it is an alloy film of one element, or a plurality of elements, selected from the group consisting of: Ta; Ti; Mo; Cr; Nb; and Si, and tungsten.

Furthermore, the metallic compound film is characterized in that it is a nitride film of tungsten in each of the above structures.

Moreover, in order to increase adhesion in each of the above structures, a silicon film having conductivity (for example, a phosphorous doped silicon film or a boron doped silicon film) may be formed as the lowest layer of the wiring.

A structure of the present invention relating to a semiconductor device is:

a semiconductor device provided with a wiring made from a tungsten film, a metallic compound film having a tungsten compound as its main constituent, or a metallic alloy film having a tungsten alloy as its main constituent, in which a taper angle $\alpha$ is within a range of 5° to 85°.

Further, another structure of the present invention relating to a semiconductor device is:

a semiconductor device provided with a wiring made from a lamination structure of laminated thin films selected from the group consisting of: a tungsten film; a metallic compound film having a tungsten compound as its main constituent; and a metallic alloy film having a tungsten alloy as its main constituent, in which a taper angle $\alpha$ is within a range of 5° to 85°.

In each of the above semiconductor related structures, the wiring is characterized in that it is a gate wiring of a TFT.

Furthermore, a structure of the present invention relating to a method of manufacturing a wiring is:

a method of manufacturing a wiring, comprising:

a step of forming a metallic thin film on a base film;

a step of forming a resist pattern on the metallic thin film; and a step of forming the wiring, in which a taper angle α is controlled in accordance with bias power density, by performing etching of the metallic thin film having the resist pattern.

Moreover, another structure of the present invention relating to a method of manufacturing a wiring is:

a method of manufacturing a wiring, comprising:

a step of forming a metallic thin film on a base film;

a step of forming a resist pattern on the metallic thin film; and a step of forming the wiring, in which a taper angle α is controlled in accordance with flow rate of a reaction gas containing fluorine, by performing etching of the metallic thin film having the resist pattern.

In each of the above structures relating to methods of manufacturing a wiring:

the method of manufacturing is characterized in that:

the etching is performed using an etching gas comprised of a mixed gas of a first reaction gas containing fluorine and a second reaction gas containing chlorine; and the specific selectivity in the etching gas between the base film and the metallic thin film is greater than 2.5.

Further, the metallic thin film in each of the above structures relating to methods of manufacturing a wiring is characterized in that it is a thin film, or a lamination film of thin films, selected from the group consisting of: a tungsten film; a metallic compound film having a tungsten compound as its main constituent; and a metallic alloy film having a tungsten alloy as its main constituent.

A structure of the present invention relating to a method of dry etching is:

a method of dry etching having the removal by an etching gas of a desired portion of a thin film selected from the group consisting of: a tungsten film; a metallic compound film having a tungsten compound as its main constituent; and a metallic alloy film having a tungsten alloy as its main constituent, characterized in that the etching gas is a mixed gas of a first reaction gas containing fluorine and a second reaction gas containing chlorine.

In the above structure of the present invention relating to the dry etching method, the first reaction gas is characterized in that it is a gas selected from the group consisting of $CF_4$, $C_2F_6$, and $C_4F_8$.

Further, in the above structure of the present invention relating to the dry etching method, the second reaction gas is characterized in that it is a gas selected from the group consisting of $Cl_2$, $SiCl_4$, and $BCl_3$.

Moreover, the etching method is characterized in that it uses an ICP etching device in the above structure of the present invention related to a method of dry etching.

The above structure of the present invention relating to the dry etching method is further characterized in that a taper angle α is controlled in accordance with the bias power density of the ICP etching device.

Another structure of the present invention relating to a method of dry etching is:

a method of dry etching characterized in that a taper angle of an inside sidewall of a hole or recess formed by etching is controlled in accordance with bias power density.

In addition, another structure of the present invention relating to a method of dry etching is:

a method of dry etching characterized in that a taper angle of an inside sidewall of a hole or recess formed by etching is controlled in accordance with specific gas flow rate.

DETAILED DESCRIPTION OF THE PREFERRED EMBODIMENTS

Embodiment Mode

The preferred embodiments of the present invention are explained using FIGS. 1 to 8B.

An ICP (inductively coupled plasma) etching device which uses a high density plasma is used in the present invention. Explained simply, the ICP etching device is a device which achieves a plasma density equal to or greater than $10^{11}/cm^3$ by inductively coupling RF power in a plasma at low pressure, and performs etching with a high selectivity and at a high etching rate.

Figure 4:
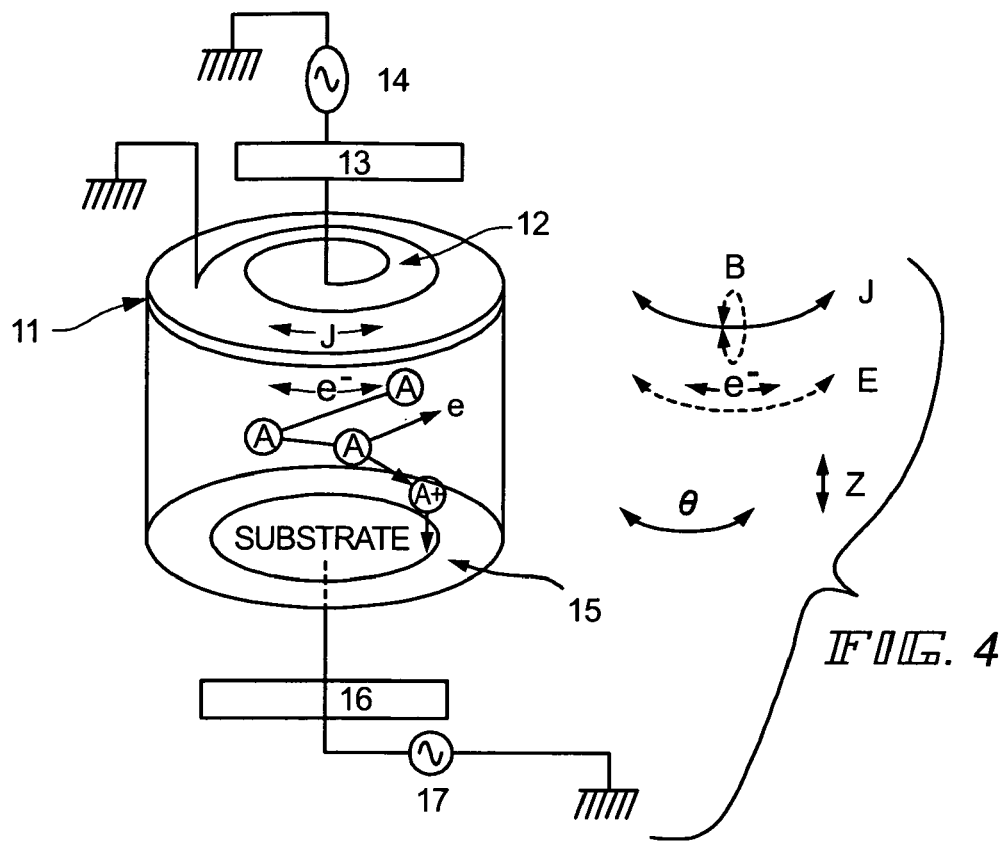
FIG. 4 is a drawing showing a plasma generation mechanism of an ICP etching device.

First, the plasma generation mechanism of the ICP dry etching device is explained in detail, using FIG. 4.

A simplified structure diagram of an etching chamber is shown in FIG. 4. An antenna coil 12 is arranged on a quartz substrate 11 in the upper portion of the chamber, and the coil 12 is connected to an RF power source 14 through a matching box 13. Further, an RF power source 17 is connected through a matching box 16 to a lower electrode 15 of a substrate arranged on the opposing side.

If an RF current is applied to the antenna coil 12 over the substrate, then an RF current J flows through the antenna coil 12 in the θ direction and a magnetic field B develops in the Z direction.

$$\mu_0 J = \text{rot } B$$

An induced electric field E develops in the θ direction in accordance with Faraday's law of electromagnetic induction.

$$-\partial B/\partial t = \text{rot } E$$

Electrons are accelerated in the θ direction in the induced electric field E and collide with gas molecules, generating a plasma. The direction of the induced electric field is the θ direction, and therefore the probability of electric charge disappearing by charged particles colliding with the etching chamber walls and the substrate is reduced. A high density plasma can therefore be generated at even a low pressure on the order of 1 Pa. Further, there is almost no magnetic field B downstream, and consequently the plasma becomes a high density plasma spread out in a sheet shape.

By regulating the RF power applied to both the antenna coil 12 (ICP power is applied) and the lower electrode 15 of the substrate (bias power is applied), it is possible to control the plasma density and the auto-bias voltage independently. Further, it is possible to vary the frequency of the applied RF power depending on the material of the piece to be processed.

Figure 5:
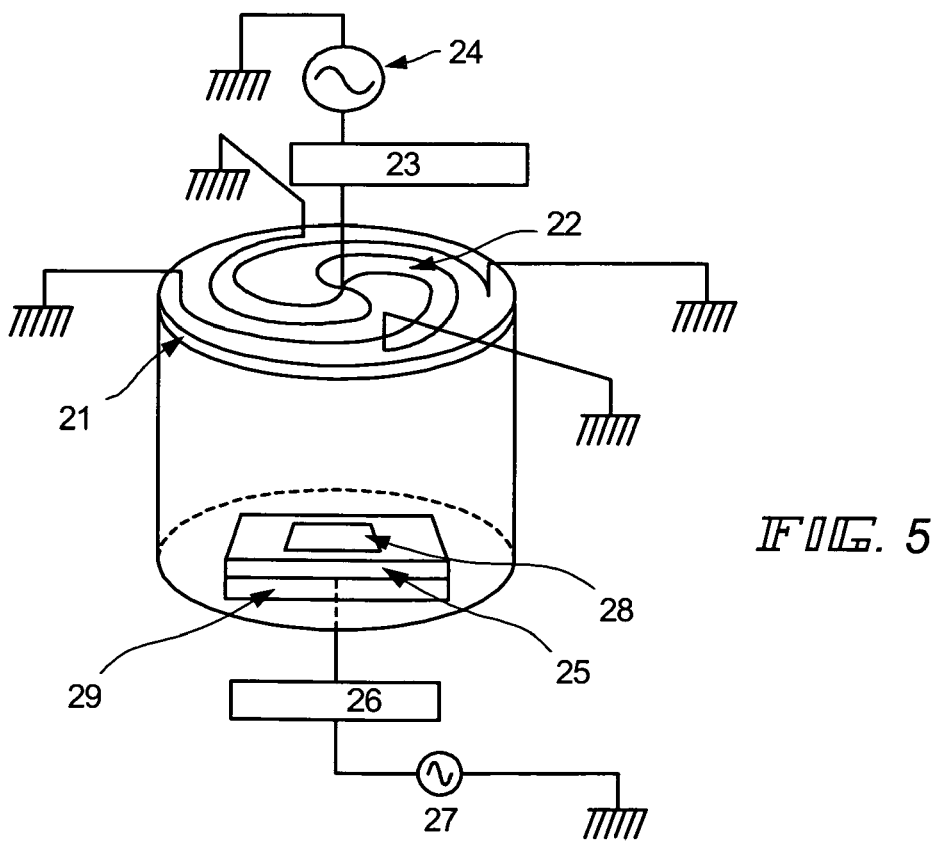
FIG. 5 is a diagram showing a multi-spiral coil method ICP etching device.

In order to obtain a high density plasma with the ICP etching device, it is necessary for the RF current J to flow with little loss in the antenna coil 12, and in order to make a large surface area, the inductance of the antenna coil 12 must be reduced. An ICP etching device with a multi-spiral coil 22, in which the antenna is partitioned, has therefore been developed, as shown in FIG. 5. Reference numeral 21 denotes a quartz substrate, reference numerals 23 and 26 denote matching boxes, and 24 and 27 denote RF power sources in FIG. 5. Further, a lower electrode 25 for holding a substrate 28 is formed through an insulator 29 in the lower portion of the chamber. If an etching device using ICP in which the multi-spiral coil is applied is used, then it is possible to perform good etching of the above heat resistant conducting material.

The inventors of the present invention performed several experiments using the multi-spiral ICP etching device (Matsushita Electric Industrial Co., Ltd. model E645) by varying the etching conditions.

The etching test piece used in the experiments is explained first. A base film (200 nm thick) is formed from a silicon oxynitride film on an insulating substrate (Corning #1737 glass substrate), and a metallic lamination film is formed thereon by sputtering. A tungsten target having a purity equal to or greater than 6N is used. Further, a single gas such as argon (Ar), krypton (Kr), or xenon (Xe), or a mixture of such gasses, may be used. Note that film deposition conditions such as sputtering power, gas pressure, and substrate temperature may be suitably controlled by the operator.

The metallic lamination film has a tungsten nitride film (film thickness: 30 nm) denoted by $WN_x$ (where $0<x<1$) as a lower layer, and has a tungsten film (370 nm thick) as an upper layer.

The metallic lamination film thus obtained contains almost no impurity elements, and in particular, the amount of oxygen contained can be made equal to or less than 30 ppm. The electrical resistivity can be made equal to or less than 20 $\mu\Omega\cdot$cm, typically between 6 and 15 $\mu\Omega\cdot$cm. Further, the film stress can be made from $-5\times10^9$ dyn/cm$^2$ to $5\times10^9$ dyn/cm$^2$.

Note that throughout this specification, a silicon oxynitride film is an insulating film denoted by $SiO_xN_y$, and denotes an insulating film containing silicon, oxygen, and nitrogen in predetermined ratios.

Patterning experiments of the metallic lamination film were performed on the etching test piece using the multi-spiral coil ICP etching device. Note that when performing dry etching, it goes without saying that resist is used and patterned into a predetermined shape, forming a resist mask pattern (film thickness: 1.5 μm).

Figure 6A:
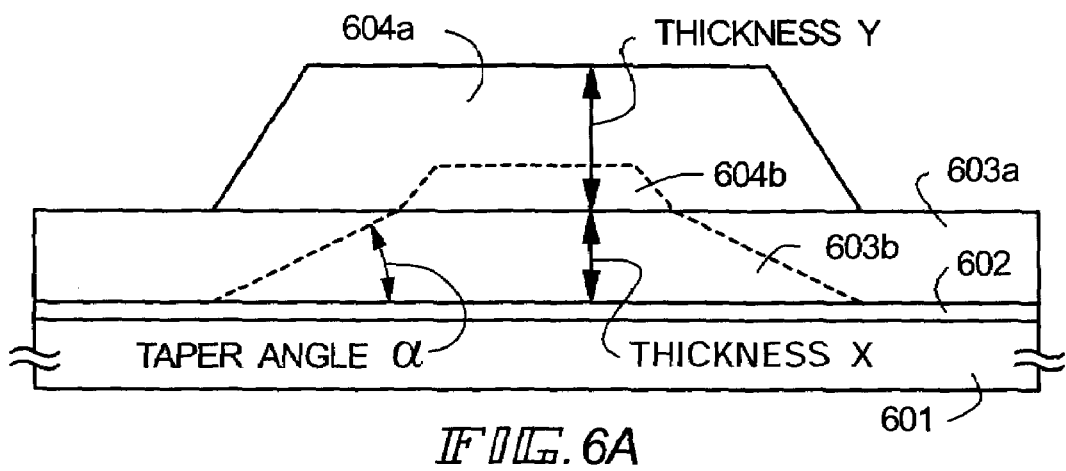
FIGS. 6A and 6B are explanatory diagrams for a taper angle α.

A cross sectional diagram of a model of the etching test piece before etching processing is shown in FIG. 6A. Reference numeral 601 denotes a substrate, reference numeral 602 denotes a base film, 603a and 603b denote a metallic lamination film (film thickness X=400 nm), and 604a and 604b denote a resist mask pattern (film thickness Y=1.5 μm) in FIG. 6A. Further, FIG. 6B is a diagram showing the state after etching processing.

Figure 6B:
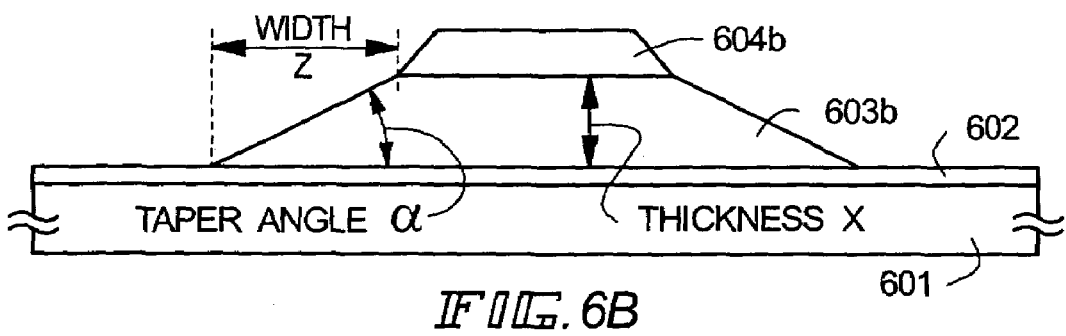

Note that, as shown in FIG. 6B, taper angle denotes an angle α between a tapered portion (inclined portion) of the cross sectional shape of the wiring 603 and the surface of the base film 602 throughout this specification. Further, the taper angle can be defined as tan α=X/Z, using the width of the tapered portion Z and the film thickness X.

The inventors of the present invention varied several conditions of the dry etching and observed the cross sectional shape of the wiring.

[Experiment 1]

Figure 1:
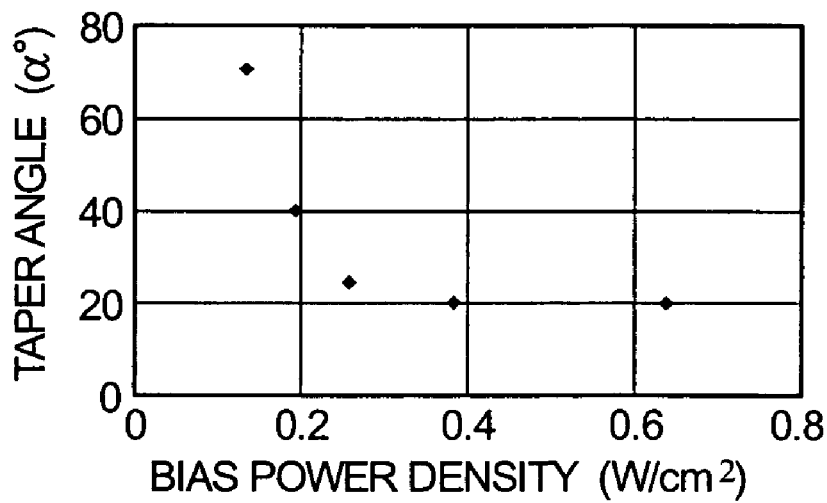
FIG. 1 is a diagram showing the dependence of a taper angle α on bias power.

FIG. 1 is a diagram showing the dependence of the taper angle α on the bias power. An experiment was performed with a 13.56 MHz bias power at 20 W, 30 W, 40 W, 60 W, and 100 W; namely, with bias power densities (W/cm$^2$) of 0.128, 0.192, 0.256, 0.384, and 0.64. Note that the lower electrode was 12.5 cm×12.5 cm. Further, the resist film thickness was 1.5 μm, the gas pressure was 1.0 Pa, and the gas composition was CF$_4$/Cl$_2$=30/30 sccm (note that sccm denotes the volume flow rate (cm$^3$/min) at standard conditions). In addition, the ICP power was 500 W; namely, the ICP power density was 1.02 W/cm$^2$. Note that, throughout this specification, the value of ICP power divided by ICP area (25 cm in diameter) is taken as the ICP power density (W/cm$^2$).

From FIG. 1, it can be understood that the higher the bias power density, the smaller the taper angle α of the wiring becomes. Further, by simply regulating the bias power density, the desired taper angle α=5° to 85° (preferably in the range of 20° to 70°) can be formed.

Figure 7A:
FIGS. 7A to 7C are cross sectional SEM photographs of wirings.
Figure 7B:
Figure 7C:
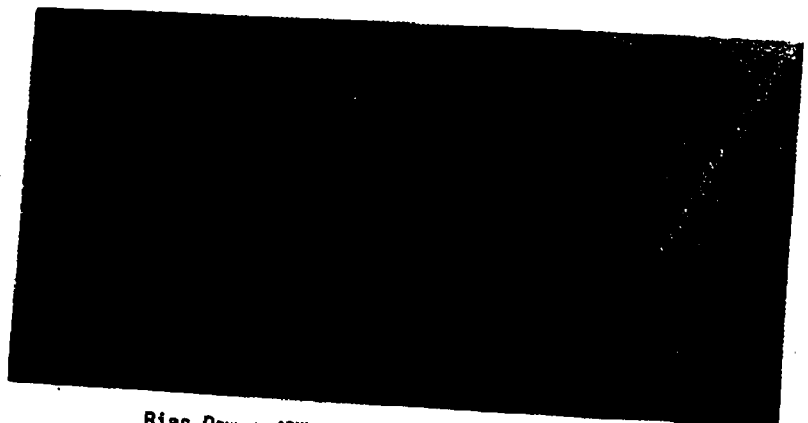
Figure 8A:
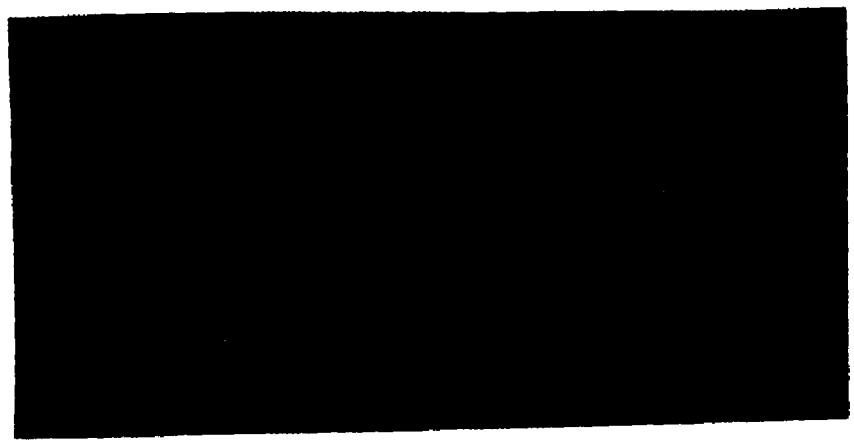
FIGS. 8A and 8B are cross sectional SEM photographs of wirings.
Figure 8B:
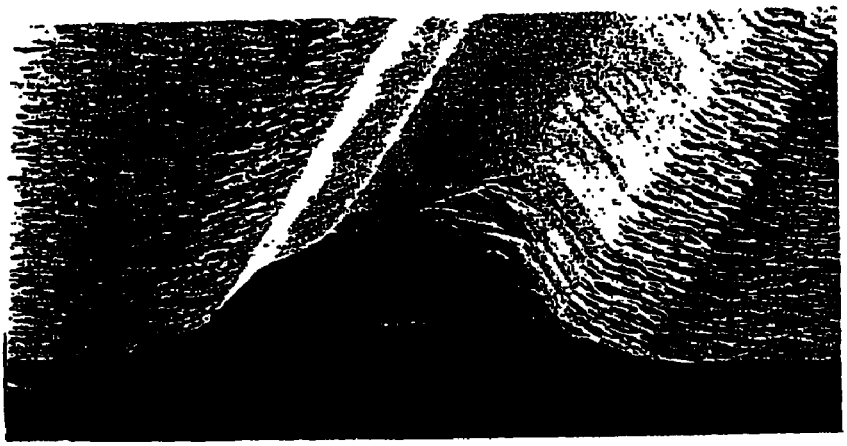

Note that a SEM photograph of a cross section when the bias power was set to 20 W (bias power density: 0.128 W/cm$^2$) is shown in FIG. 7A; a SEM photograph of a cross section when the bias power was set to 30 W (bias power density: 0.192 W/cm$^2$) is shown in FIG. 7B; a SEM photograph of a cross section when the bias power was set to 40 W (bias power density: 0.256 W/cm$^2$) is shown in FIG. 7C; a SEM photograph of a cross section when the bias power was set to 60 W (bias power density: 0.384 W/cm$^2$) is shown in FIG. 8A; and a SEM photograph of a cross section when the bias power was set to 100 W (bias power density: 0.64 W/cm$^2$) is shown in FIG. 8B. It can be observed from each SEM photograph shown in FIGS. 7A to 8B that the taper angle α is formed within the range of 20° to 70°, and that the taper angle α can be controlled by changing the bias power density.

It is thought that this is because the selectivity between tungsten and resist becomes small, and a retreating phenomenon of the resist develops.

[Experiment 2]

Figure 2:
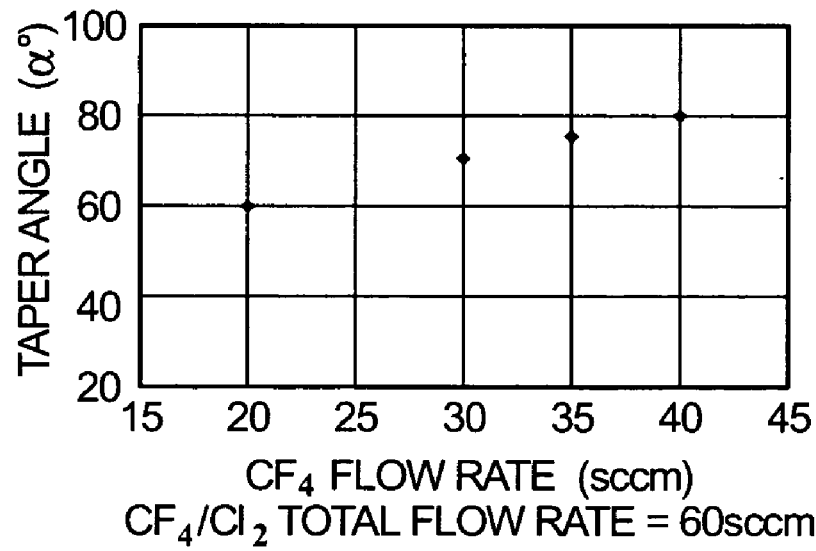
FIG. 2 is a diagram showing the dependence of the taper angle α on specific $CF_4$ flow rate.

FIG. 2 is a diagram showing the dependence of the taper angle α on the specific flow rate of $CF_4$. Experiments were performed with gas composition ratios of $CF_4/Cl_2$=20/40 sccm, 30/30 sccm, and 40/20 sccm. The gas pressure was 1.0 Pa, the bias power density was 0.128 W/cm$^2$, the resist film thickness was 1.5 μm, and the ICP power was 500 W (ICP power density: 1.02 W/cm$^2$).

From FIG. 2, it is understood that the larger the specific flow rate of $CF_4$, the larger the selectivity between tungsten and resist, and the larger the taper angle α of the wiring becomes. Further, the roughness of the base film becomes less. Regarding the roughness of the base film, it is thought that the reason is due to weak anisotropy of the etching caused by an increase in the flow rate of $CF_4$ (decrease in the flow rate of $Cl_2$). Furthermore, by simply regulating the specific flow rate of $CF_4$, the desired taper angle α=5° to 85° (preferably in the range of 60° to 80°) can be formed.

[Experiment 3]

An experiment was performed by setting the 13.56-MHz ICP power to 400 W, 500 W, and 600 W; namely, by setting the ICP power density to 0.82, 1.02, and 1.22. The bias power was 20 W (bias power density: 0.128 W/cm$^2$), the resist film thickness was 1.5 μm, the gas pressure was 1.0 Pa, and the gas composition was $CF_4/Cl_2$=30/30 sccm.

The etching rate of tungsten becomes larger as the ICP power density gets larger, but the etching rate distribution becomes worse. Further, there are no particular changes seen in the taper angle.

[Experiment 4]

An experiment was performed with gas pressures of 1.0 Pa and 2.0 Pa. The ICP power was 500 W (ICP power density: 1.02 W/cm$^2$), the gas composition was $CF_4/Cl_2$=30/30 sccm, the bias power was 20 W (bias power density: 0.128 W/cm$^2$), and the resist film thickness was 1.5 μm.

The tungsten etching rate becomes faster along with higher vacuum, and the anisotropy also becomes stronger. Further, the taper becomes a reverse taper shape at 2.0 Pa.

[Experiment 5]

An experiment was performed with the total flow rate of the etching gas set to 60 sccm and 120 sccm. The gas pressure was 1.0 Pa, the ICP power was 500 W (ICP power density: 1.02 W/cm$^2$), the gas composition was $CF_4/Cl_2$=30/30 sccm, the bias power was 20 W (bias power density: 0.128 W/cm$^2$), and the resist film thickness was 1.5 μm.

The etching rate becomes a little larger for the case of the larger total flow rate of the etching gas.

Figure 3:
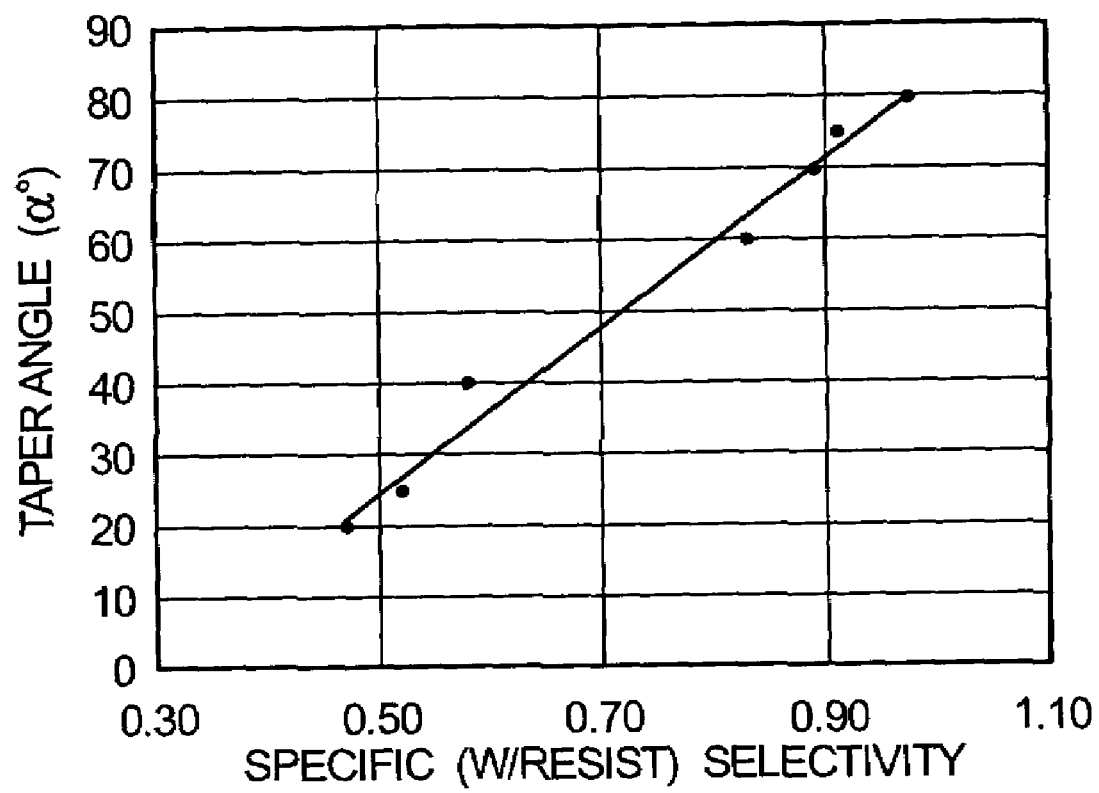
FIG. 3 is a diagram showing the dependence of the taper angle α on specific (W/resist) selectivity.

From the results of the above experiments, it is thought that there is a dependence of the taper angle on the selectivity between tungsten and resist because the taper angle is mainly influenced by the bias power density conditions. The dependence of the taper angle on the selectivity between tungsten and resist is shown in FIG. 3.

Figure 9A:
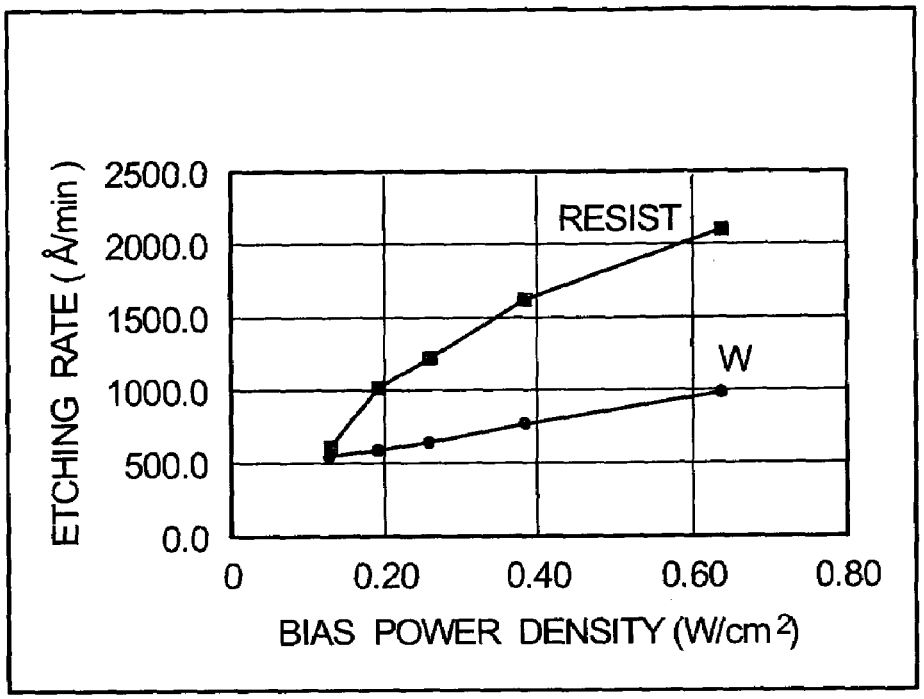
FIGS. 9A and 9B are diagrams showing the dependence of etching rate and specific (W/resist) selectivity on bias power.
Figure 9B:
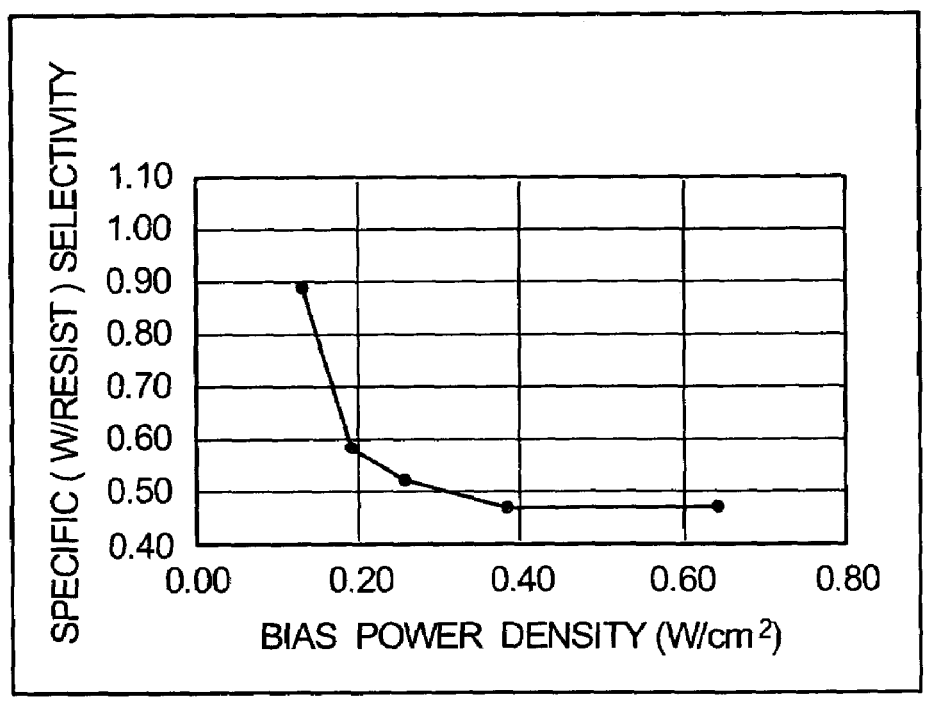

Changes in bias power density have a larger influence on the selectivity between tungsten and resist than on the etching rate of tungsten, and if the bias power density is made large, then there is a tendency for the selectivity between tungsten and resist to fall. The dependence of etching rates of tungsten and resist on bias power density is shown in FIG. 9A, while the dependence of the selectivity between tungsten and resist on bias power density is shown in FIG. 9B.

Namely, as shown in FIG. 6A and in FIG. 6B, resist is etched at the same time as tungsten is etched, and therefore if the selectivity between tungsten and resist is large, the taper angle becomes large, and if the selectivity between tungsten and resist is small, the taper angle becomes small.

Figure 10A:
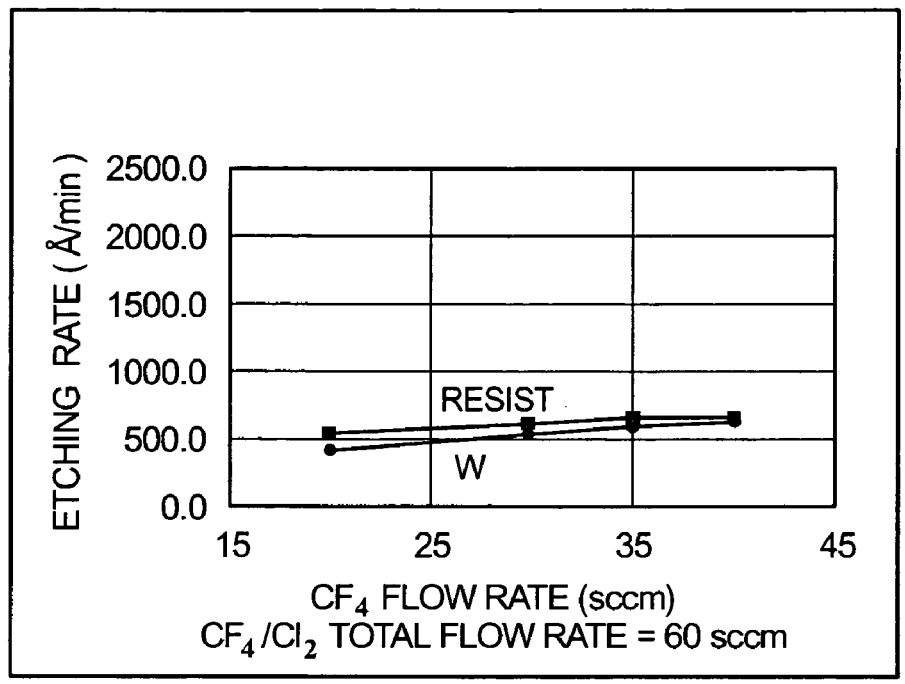
FIGS. 10A and 10B are diagrams showing the dependence of etching rate and specific (W/resist) selectivity on specific $CF_4$ flow rate.
Figure 10B:
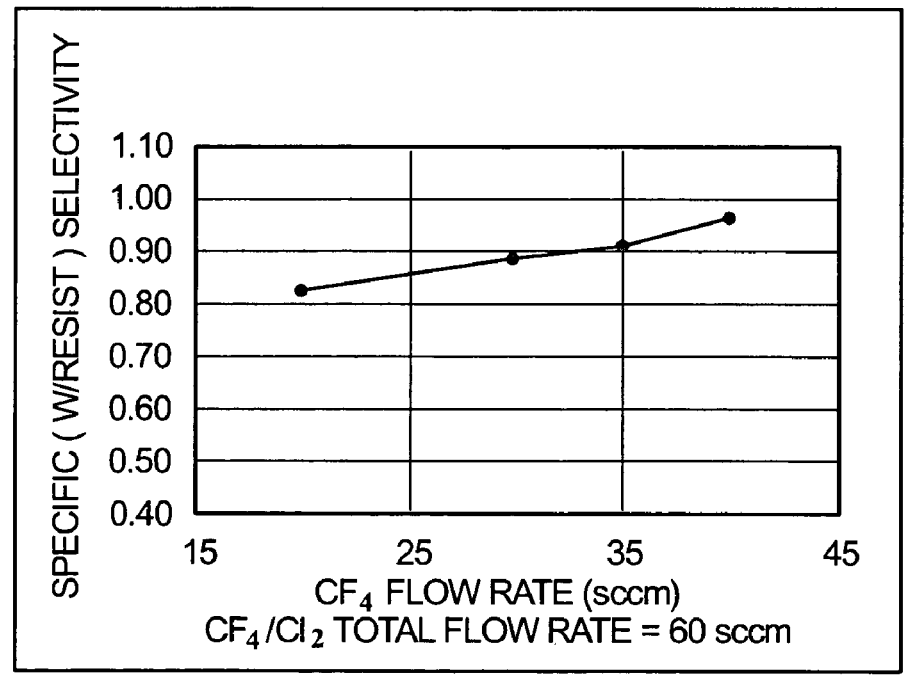

Further, if the specific flow rate of $CF_4$ gas is made smaller in the same way, then there is a tendency for the selectivity between tungsten and resist to fall. FIG. 10A shows the dependence of etching rates of tungsten and resist on specific $CF_4$ gas flow rate, and FIG. 10B shows the dependence of the selectivity between tungsten and resist on specific $CF_4$ gas flow rate.

Figure 11A:
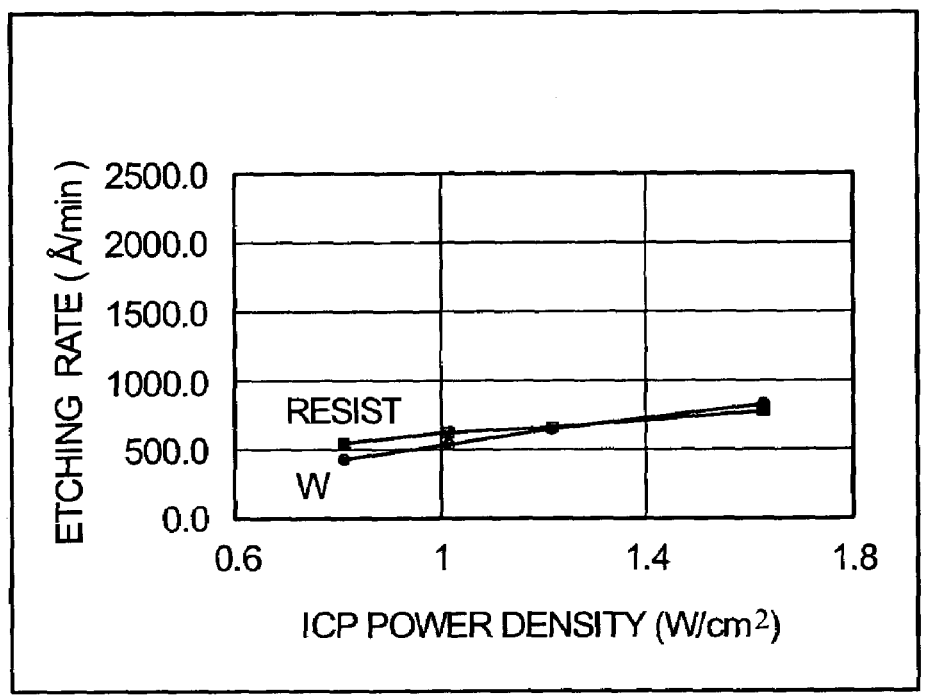
FIGS. 11A and 11B are diagrams showing the dependence of etching rate and specific (W/resist) selectivity on ICP power.
Figure 11B:
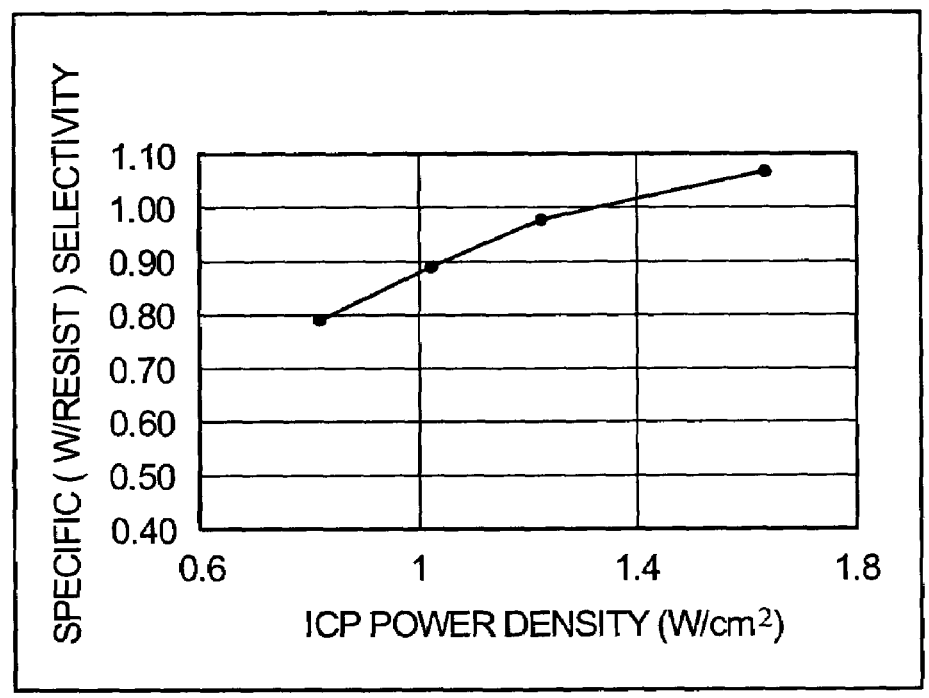

Further, the dependence of etching rates of tungsten and resist on ICP power density is shown in FIG. 11A, and the dependence of the selectivity between tungsten and resist on ICP power density is shown in FIG. 11B.

A test piece in which a base film (200 nm thick) made from a silicon oxynitride film is formed on an insulating substrate, and a metallic lamination film (a lamination film of a tungsten nitride film and a tungsten film) is formed on the base film is used as a test piece for etching in each of the above experiments, but with the present invention, it is also possible to apply a thin film, or a lamination structure of a lamination of thin films, selected from the group consisting of a tungsten film, a metallic compound film having a tungsten compound as its main constituent, and a metallic alloy film having a tungsten alloy as its main constituent. Note, however, that films in which the selectivity with the base film is equal to or less than 2.5, and cases in which the etching rate is extremely small can not be applied. For example, a W—Mo alloy film (having a ratio of W:Mo=52:48 by weight) possesses a selectivity with the base film ($SiO_xN_y$) which is equal to or less than approximately 1.5, and the etching rate is small at approximately 50 nm/min, and therefore it is not suitable from a workability standpoint.

A W film is shown as one example here, but for generally known heat resistant conducting materials (such as Ta, Ti, Mo, Cr, Nb, and Si), when an ICP etching device is used, the edge of a pattern can easily be made into a tapered shape. For example, if a Ta film with an etching speed of 140 to 160 nm/min and a selectivity of 6 to 8 is chosen, it has superior values in comparison with the W film having an etching speed of 70 to 90 nm/min and a selectivity of 2 to 4. Therefore, from the standpoint of workability, the Ta film is also suitable, but the Ta film has a resistivity of 20 to 30 μΩ·cm, which is little high in comparison with the resistivity of the W film, from 10 to 16 μΩ·cm, and this becomes a problem.

Further, a gas mixture of $CF_4$ gas and $Cl_2$ gas is used as the etching gas for the above dry etching, but there are no particular limitations on this, and it is also possible to use a mixed gas of a reactive gas containing fluorine selected from the group consisting of $C_2F_6$, and $C_4F_8$, and a gas containing chlorine selected from the group consisting of $Cl_2$, $SiCl_4$, and $BCl_3$.

In addition, there are no particular limitations on the etching conditions of the present invention, and for a case of using, for example, an ICP etching device (Matsushita Electric Industrial Co., Ltd. Model E645) and using carbon tetrafluoride gas ($CF_4$) and chlorine ($Cl_2$), the etching conditions may be suitably determined by the operator within the following ranges:

| | |
|---|---|
| etching gas total flow rate: | 60 to 120 sccm |
| specific etching gas flow rate: | $CF_4/Cl_2$ = 30/30 sccm to 50/10 sccm |
| gas pressure: (pressure of etching gas atmosphere) | 1.0 Pa to 2.0 Pa |

-continued

| | |
|---|---|
| ICP power density: | 0.61 W/cm² to 2.04 W/cm² (ICP power: 300 W to 1000 W), frequency of 13 MHz to 60 MHz |
| bias power density: | 0.064 W/cm² to 3.2 W/cm² (bias power: 10 W to 500 W), frequency of 100 kHz to 60 MHz, preferably 6 MHz to 29 MHz |
| substrate temperature: | 0° C. to 80° C., preferably 70° C. ± 10° C. |

Note that, throughout this specification, the term "electrode" refers to a portion of the "wiring", and denotes a location for performing electrical connection to another wiring, or a location for intersection with a semiconductor layer. Therefore, for convenience, while the use of "wiring" and "electrode" is properly divided, "wiring" is normally included for sentences using "electrode".

A detailed explanation of the present invention, having the above structure, is made using the embodiments shown below.

[Embodiment 1]

Figure 12:
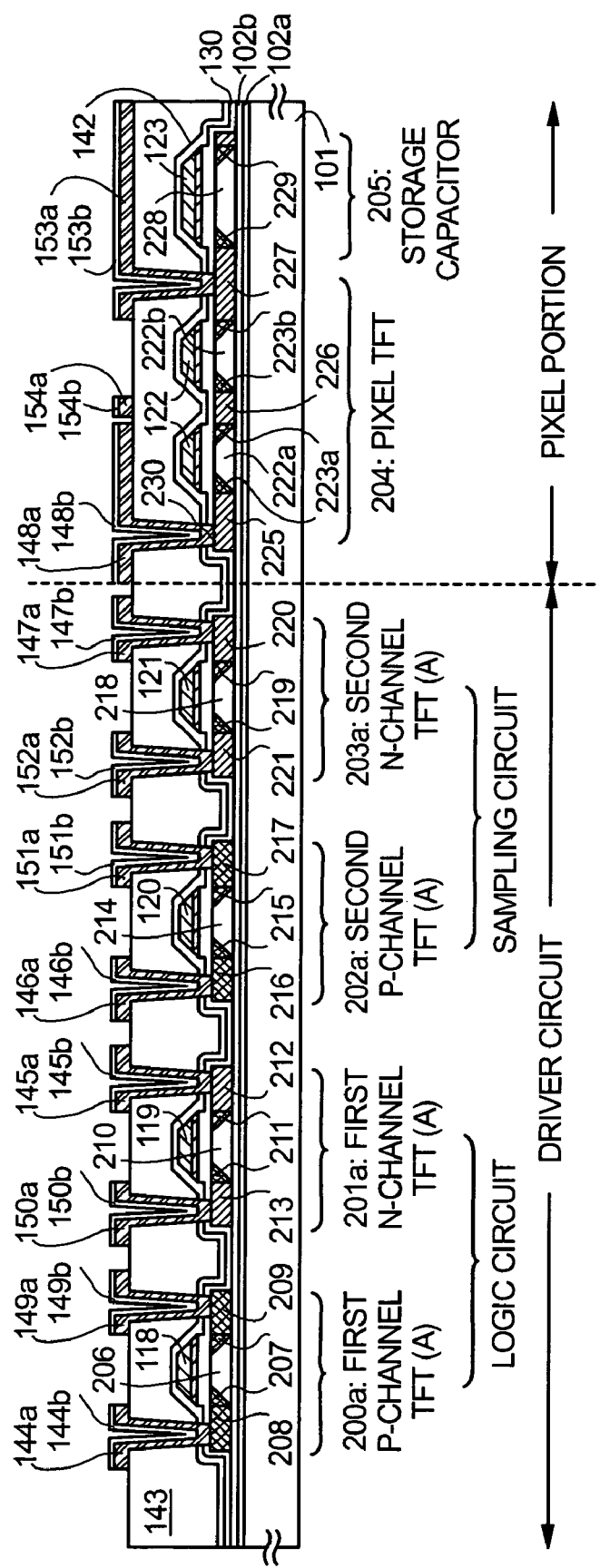
FIG. 12 is a cross sectional diagram of an active matrix type liquid crystal display device.
Figure 13:
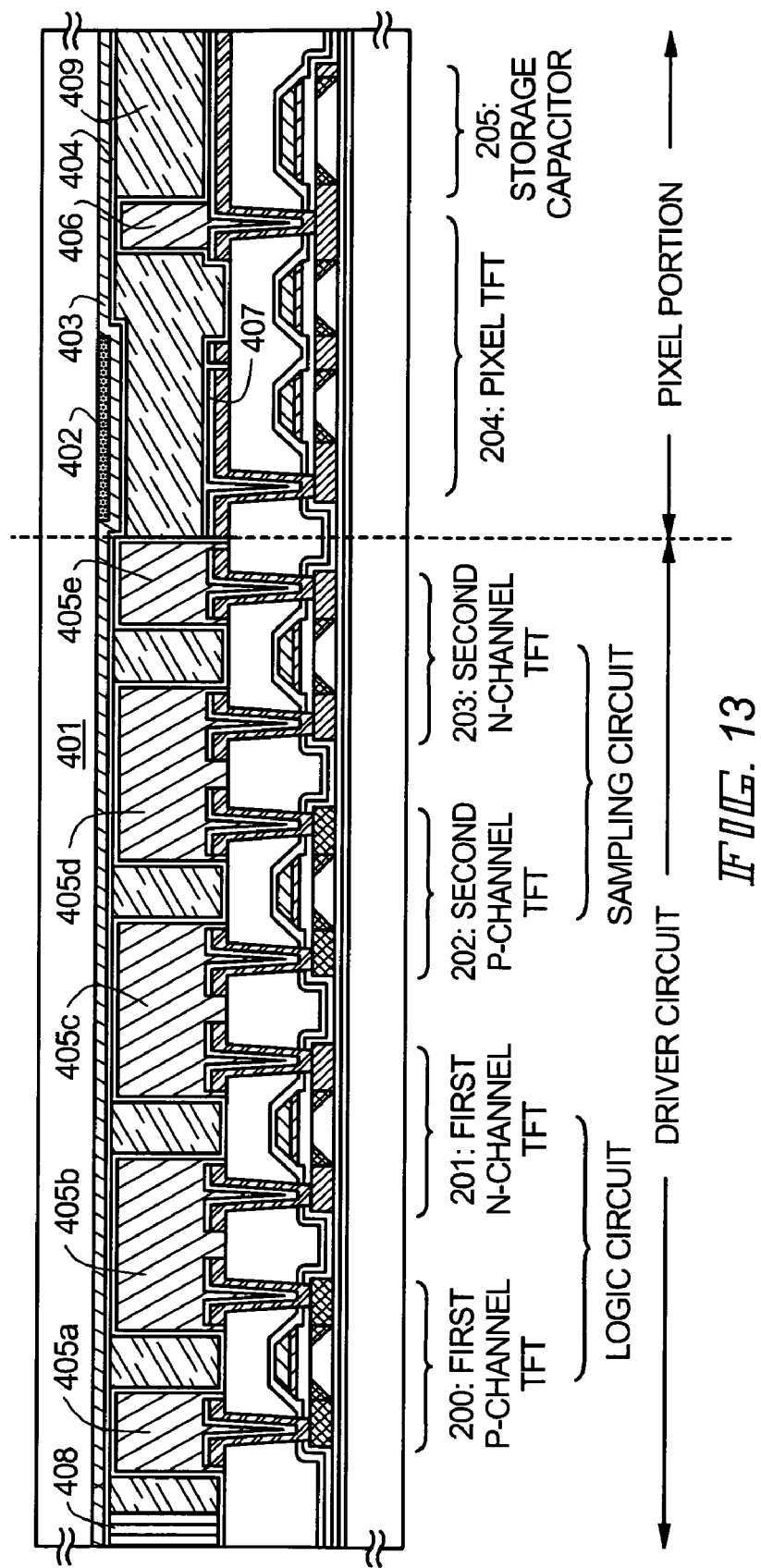
FIG. 13 is a cross sectional diagram of an active matrix type liquid crystal display device.

Embodiment 1 of the present invention is explained using FIGS. 12 and 13. An active matrix substrate having a pixel TFT and a storage capacitor of a pixel portion, and a driver circuit TFT formed in the periphery of the pixel portion manufactured at the same time, is explained here.

The structure of embodiment 1 has TFTs formed on a substrate 101 having an insulating surface, as shown in FIG. 12. It is preferable to use a glass substrate or a quartz substrate for the substrate 101. It is also possible to use a plastic substrate, provided that the heat resistance is acceptable. In addition, if a reflecting type display device is being manufactured, then a silicon substrate, a metallic substrate, or a stainless steel substrate, having an insulating film formed on the surface, may also be used as the substrate.

The surface of the substrate 101 on which the TFTs are formed has a base film 102 made from an insulating film containing silicon (a generic name indicating a silicon oxide film, a silicon nitride film, or a silicon oxynitride film throughout this specification). For example, a lamination film of a silicon oxynitride film 102a with a thickness of 10 to 200 nm (preferably between 50 and 100 nm) and manufactured by plasma CVD from $SiH_4$, $NH_3$, and $N_2O$, and a hydrogenated silicon oxynitride film 102b with a thickness of 50 to 200 nm (preferably between 100 and 150 nm) and manufactured similarly from $SiH_4$, $N_2O$, and $H_2$, is formed. A two-layer structure is shown for the base film 102 here, but a single layer insulating film or a lamination film having more than two layers may also be formed.

Further, active layers of the TFTs are formed on the base film 102. A crystalline semiconductor film, obtained from crystallizing a semiconductor film having an amorphous structure, on which patterning is then performed is used as the active layers. A known technique, for example, laser annealing or thermal annealing (solid phase growth methods), rapid thermal annealing (RTA method), or a crystallization method using a catalytic element, in accordance with the technique disclosed in Japanese Patent Application Laid-open No. Hei 7-130652, may be used as the crystallization method. Note that amorphous semiconductor films and microcrystalline semiconductor films exist as semiconductor films having an amorphous structure, and that a compound semiconductor film having an amorphous structure, such as an amorphous silicon germanium film, may also be applied.

A gate insulating film 130 covering the above TFT active layers is formed by using plasma CVD or sputtering from an insulating film containing silicon with a thickness of 40 to 150 nm. A 120 nm thick silicon oxynitride film is formed in embodiment 1. Further, a silicon oxynitride film manufactured by doping $O_2$ into $SiH_4$ and $N_2O$ has a reduced fixed electric charge density within the film, and therefore it is a desirable material for use. The gate insulating film is not limited to this type of silicon oxynitride film, of course, and other insulating films containing silicon may be used in either a single layer or a lamination structure.

A heat resistant conducting material is used for gate electrodes 118 to 122 and a capacitor electrode 123 formed on the gate insulating film, which have a lamination structure of a conducting layer (A) made from a conducting metallic nitride film and a conducting layer (B) made from a metallic film. The conducting layer (B) may be formed from an element selected from the group consisting of Ta, Ti, and W, or from an alloy having one of the above elements as its main constituent, or from an alloy film of a combination of the above elements. In embodiment 1, a conducting lamination film of a 50 nm thick WN film formed as the conducting layer (A) and a 250 nm thick W film formed as the conducting layer (B) by sputtering which uses a W target having a purity of 6 N and in which Ar gas and nitrogen ($N_2$) gas are introduced, is patterned, completing the gate electrodes 118 to 122 and the capacitor electrode 123. Note that etching is performed so that a tapered portion is formed in the edges of the gate electrodes 118 to 123. The etching process is performed using an ICP etching device. Details of this technique are as shown in the embodiment mode of the present invention. In embodiment 1, etching is performed using a gas mixture of $CF_4$ and $Cl_2$ for the etching gas, with the flow rate 30, sccm each, the ICP power density set to 3.2 W/cm² (frequency: 13.56 MHz), the bias power density set to 0.224 W/cm² (frequency: 13.56 MHz), and a gas pressure of 1.0 Pa. By using these etching conditions, a tapered portion is formed in the edge portions of the gate electrodes 118 to 122 and the capacitor electrode 123, in which the thickness increases gradually from the edge portion toward the inside. The angle can be made from 25 to 35°, preferably 30°.

Note that, in order to perform etching so as not to leave any residue when forming the gate electrodes 118 to 122 and the capacitor electrode 123 which have the tapered shape, overetching is performed, in which the etching time is increased on the order of 10 to 20%, and therefore the gate insulating film 130 has a portion which becomes thin in practice.

Further, in embodiment 1, in order to form desired LDD regions, an impurity element for imparting n-type or p-type conductivity is added into the active layers in a self-aligning manner by ion doping with the gate electrodes 118 to 122 having the tapered portions in their edges, as masks. Furthermore, in order to form suitable, desired LDD regions, an impurity element for imparting n-type or p-type conductivity is added to the active layers by ion doping with a resist pattern as a mask.

A structure having a channel forming region 206, an LDD region 207 overlapping with the gate electrode, a source region 208 composed of a high concentration p-type impurity region, and a drain region 209 in the active layer is thus formed in a first p-channel TFT (A) 200a of the driver circuit. A first n-channel TFT (A) 201a has a channel forming region 210, an LDD region 211 made from a low concentration n-type impurity region overlapping the gate electrode 119, a source region 212 formed of a high concentration n-type impurity region, and a drain region 213 in the active layer. While the channel length, is 3 to 7 μm, the LDD region overlapping the gate electrode 119, which is $L_{ov}$, is 0.1 to 1.5 μm, preferably 0.3 and 0.8 μm, in length in the channel length direction. The length of $L_{ov}$ is controlled by the thickness of the gate electrode 119 and the angle of the tapered portion.

Further, the active layer in a second p-channel TFT (A) 202a of the driver circuit similarly has a channel forming region 214, an LDD region 215 overlapping the gate electrode 120, a source region 216 formed of a high concentration p-type impurity region, and a drain region 217. In a second n-channel TFT (A) 203a, the active layer has a channel forming region 218, an LDD region 219 overlapping the gate electrode 121, a source region 220 formed of a high concentration n-type impurity region, and a drain region 221. The LDD region 219 has the same structure as the LDD region 211. A pixel TFT 204 has channel forming regions 222a and 222b, LDD regions 223a and 223b formed of low concentration n-type impurity regions, and source or drain regions 225 to 227 formed of high concentration n-type impurity regions in the active layer. The LDD regions 223a and 223b have the same structure as the LDD region 211. In addition, a storage capacitor 205 is formed from the capacitor wiring 123, the gate insulating film, and semiconductor layers 228 and 229 connected to the drain region 227 of the pixel TFT 204. In FIG. 12, the n-channel TFT and the p-channel TFT of the driver circuit have a single gate structure in which one gate electrode is provided between the source and drain pair, and the pixel TFT has a double gate structure, but all of the TFTs may be given a single gate structure, and a multi-gate structure in which a plurality of gate electrodes are provided between one source and drain pair will not cause any hindrance.

Further, there is a protecting insulating film 142 covering the gate electrode and the gate insulating film 130. The protecting insulating film may be formed of a silicon oxide film, a silicon oxynitride film, a silicon nitride film, or of a lamination film of a combination of these films.

In addition, there is an interlayer insulating film 143 made from an organic insulating material covering the protecting insulating film 142. Materials such as polyimide, acrylic, polyamide, polyimide amide, and BCB (benzocyclobutene) can be used as an organic resin material.

Moreover, there are source wirings and drain wirings on the interlayer insulating film 143 for connecting to the source regions of drain regions formed on the respective active layers, through contact holes. Note that the source wirings and the drain wirings have a lamination structure of a lamination film of Ti and aluminum, denoted by reference numerals 144a to 154a, and a transparent conducting film, denoted by reference numerals 144b to 154b. Further, the drain wirings 153a and 153b also function as pixel electrodes. An indium oxide and zinc oxide alloy ($In_2O_3$—ZnO) and zinc oxide (ZnO) are suitable materials for the transparent conducting film, and in order to additionally increase the transmissivity and the conductivity, materials such as zinc oxide in which gallium (Ga) has been added (ZnO:Ga) can be ideally used.

With the above construction, the structure of TFTs constituting each circuit is optimized in accordance with the specifications required by the pixel TFT and the driver circuit, and it is possible to increase the operating performance and the reliability of a semiconductor device. In addition, by forming the gate electrodes with a conducting material having heat resistance, the activation of the LDD regions or the source regions and drain regions becomes easy.

Additionally, during formation of the LDD region overlapping the gate electrode through the gate insulating film, by forming the LDD region which possesses a concentration gradient of an impurity element added with the aim of controlling the conductivity type, it can be expected that the electric field relaxation effect will be increased, particularly in the vicinity of the drain region.

The active matrix substrate shown in FIG. 12 can be applied as is to a reflective type liquid crystal display device.

An active matrix type liquid crystal display device, in which the active matrix substrate shown in FIG. 12 is applied, is explained next using FIG. 13.

First, a resin film on the active matrix substrate is patterned, forming rod shape spacers 405a to 405e and 406. The placement of the spacers may be arbitrarily determined. Note that a method of forming the spacers by dispersing grains of several μm may also be used.

An alignment film 407 is formed next in the pixel portion of the active matrix substrate from a material such as a polyimide resin in order to orient the liquid crystals. After forming the alignment film, a rubbing process is performed, orienting the liquid crystal molecules so as to possess a certain fixed pre-tilt angle.

A light shielding film 402, a transparent conducting film 403, and an alignment film 404 are formed in an opposing substrate 401 on the opposite side. The light shielding film 402 is formed with a thickness of 150 to 300 nm by a film such as a Ti film, a Cr film, or an Al film. The active matrix substrate, on which the pixel portion and the driver circuit are formed, and the opposing substrate are then joined together by a sealing member 408.

Afterward, a liquid crystal material 409 is injected between both substrates. A known liquid crystal material may be used for the liquid crystal material. For example, in addition to a TN liquid crystal, a thresholdless antiferroelectric mixed liquid crystal, indicating an electro-optical response in which the transmissivity changes continuously with respect to an electric field, can also be used Some thresholdless antiferroelectric mixed liquid crystal has V-shape electro-optical response characteristic. The reflecting type active matrix type liquid crystal display device shown in FIG. 13 is thus completed.

[Embodiment 2]

Figure 14:
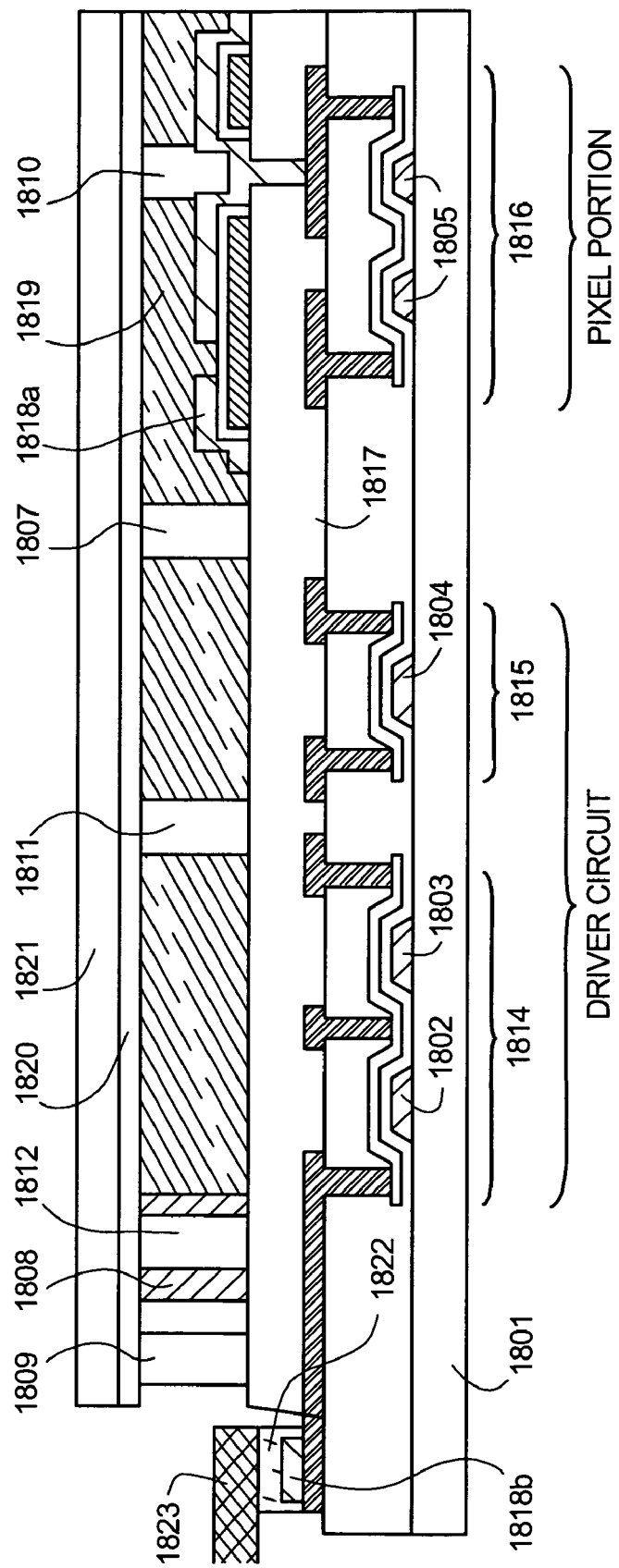
FIG. 14 is a cross sectional diagram of an active matrix type liquid crystal display device.

Using FIG. 14, embodiment 2 shows an example of manufacturing a display device using a bottom gate TFT which differs from embodiment 1 (a top gate TFT) above.

First, a metallic lamination film is formed by sputtering on an insulating substrate 1801. The metallic lamination film has a tungsten nitride film for a bottom layer and a tungsten film for a top layer. Note that a base film contacting the substrate may also be formed, from a film such as a silicon oxynitride film denoted by $SiO_xN_y$. Next, a resist mask for obtaining a desired gate wiring pattern is formed by photolithography.

It is necessary for constituents such as a gate insulating film and a channel forming region to be formed on the gate wiring in the bottom gate TFT. In order to increase the characteristics of the bottom gate structure TFT, the coverage of the films formed on the gate wiring, and the withstand voltage of the gate insulating film, it is preferable that the taper angle of gate wirings 1802 to 1805 be equal to or less than 60°, more preferably equal to or less than 40°.

Next, as shown above in the embodiment mode of the present invention, the taper angle of the gate wirings 1802 to 1805 is made equal to or less than 60°, more preferably equal to or less than 40°, using an ICP etching device and selecting suitably the bias power or the specific gas flow rate. Known techniques may be used for subsequent processing, and there are no particular limitations imposed.

In FIG. 21, reference numeral 1814 denotes a CMOS circuit, reference numeral 1815 denotes an n-channel TFT, 1816 denotes a pixel TFT, 1817 denotes an interlayer insulating film, 1818*a* denotes a pixel electrode, and 1818*b* denotes an ITO film. The ITO film 1818*b* is formed in order to be connected to an external terminal such as an FPC 1823 through adhesive 1822. Further, reference numeral 1819 denotes a liquid crystal material, and 1820 denotes an opposing electrode. In addition, reference numeral 1801 denotes the first substrate, 1808 denotes a sealing region, 1807, and 1809 to 1812 denote rod shape spacers, and 1821 denotes a second substrate.

Note that it is possible to freely combine embodiment 2 with embodiment 1.

[Embodiment 3]

Figure 15A:
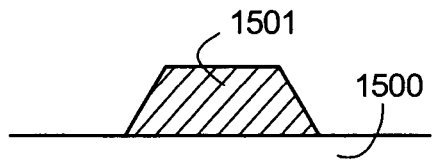
FIGS. 15A to 15F are cross sectional diagrams of wirings.

Examples of various wiring structures formed on an insulating surface by utilizing the present invention are shown in FIGS. 15A to 15F. A cross sectional diagram of a single layer structure wiring made from a material 1501 having tungsten as its main constituent and formed on a film (or a substrate) 1500 having an insulating surface is shown in FIG. 15A. This wiring is formed by patterning a film formed by sputtering which uses a target with a purity of 6N (99.9999%) and a single gas, argon (Ar), as the sputtering gas. Note that the stress is controlled by setting the substrate temperature equal to or less than 300° C., and by setting the sputtering gas pressure equal to or greater than 1.0 Pa, and that other conditions (such as the sputtering power) may be suitably determined by the operator.

When performing the above patterning, a taper angle $\alpha$ is controlled by the method shown in the embodiment mode of the present invention, in accordance with the bias power density, for example.

The cross sectional shape of the wiring 1501 thus obtained has the desired taper angle $\alpha$. Further, there are almost no impurity elements contained in the wiring 1501, and in particular, the amount of oxygen contained can be made equal to or less than 30 ppm, and the electrical resistivity can be made equal to or less than 20 $\mu\Omega\cdot cm$, typically between 6 $\mu\Omega\cdot cm$ and 15 $\mu\Omega\cdot cm$. Further, the film stress can be controlled within the range of $-5\times10^{10}$ to $5\times10^{10}$ $dyn/cm^2$.

Figure 15B:
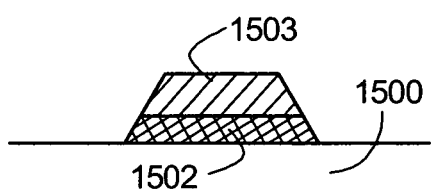

FIG. 15B shows a two-layer structure, similar to the gate electrode of embodiment 1. Note that tungsten nitride ($WN_x$) is taken as the lower layer, and that tungsten is taken as the upper layer. Also note that the thickness of a tungsten nitride film 1502 may be set from 10 to 50 nm (preferably between 10 and 30 nm), and that the thickness of a tungsten film 1503 may be set from 200 to 400 nm (preferably between 250 and 350 nm). The two films are laminated in succession, without exposure to the atmosphere, using sputtering in embodiment 3.

Figure 15C:
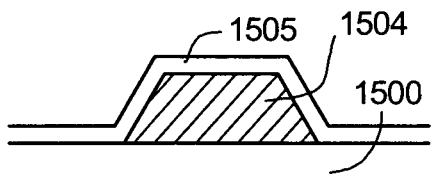

FIG. 15C is an example of covering a wiring 1504, made from a material having tungsten as its main constituent and formed on the film (or substrate) 1500 which possesses an insulating surface, by an insulating film 1505. The insulating film 1505 may be formed of a silicon nitride film, a silicon oxide film, a silicon oxynitride film $SiO_xN_y$ (where 0<x, and y<1), or of a lamination film of a combination of these films.

Figure 15D:
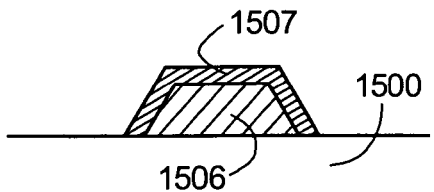

FIG. 15D is an example of covering the surface of a wiring 1506 made from a material having tungsten as its main constituent, and formed on the film (or substrate) 1500 having an insulating surface, by a tungsten nitride film 1507. Note that if a nitriding process, such as plasma nitriding, is performed on the wiring in the state of FIG. 15A, then the structure of FIG. 15D can be obtained.

Figure 15E:
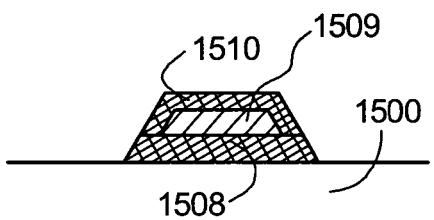

FIG. 15E is an example of surrounding a wiring 1509 made from a material having tungsten as its main constituent, and formed on the film (or substrate) 1500 having an insulating surface, by tungsten nitride films 1510 and 1508. Note that if a nitriding process, such as plasma nitriding, is performed on the wiring in the state of FIG. 15B, then the structure of FIG. 15E can be obtained.

Figure 15F:
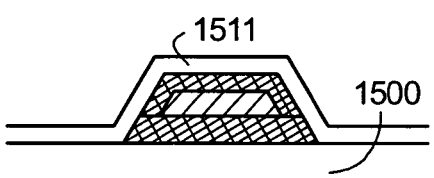

FIG. 15F is an example of covering by an insulating film 1511, after forming the state of FIG. 15E. The insulating film 1511 may be formed of a silicon nitride film, a silicon oxide film, a silicon oxynitride film, or a lamination film of a combination of these films.

The present invention can thus be applied to various wiring structures. It is possible to freely combine the constitution of embodiment 3 with the constitutions shown in embodiment 1 and in embodiment 2.

[Embodiment 4]

A case of applying the present invention to a reflection type liquid crystal display device manufactured over a silicon substrate is explained in Embodiment 4. As a substitute for the active layer comprising a crystalline silicon film in Embodiment 1, an impurity element for imparting n-type or p-type conductivity is added directly into a silicon substrate (silicon wafer), and the TFT structure may be realized. Further, the structure is reflection type, and therefore a metallic film having a high reflectivity (for example, aluminum, silver, or an alloy of these (an Al—Ag alloy)) and the like may be used as a pixel electrode.

Note that it is possible to freely combine the constitution of Embodiment 4 with the constitution of any of embodiments 1 to 3.

[Embodiment 5]

It is possible to use the present invention when forming an interlayer insulating film over a conventional MOSFET, and then forming a TFT on that. In other words, it is possible to realize a semiconductor device with a three dimensional structure. Further, it is possible to use an SOI substrate such as SIMOX, Smart-Cut (a trademark of SOITEC), or ELTRAN (a trademark of Cannon, Inc.)

Note that it is possible to freely combine the structure of embodiment 5 with the structure of any of embodiments 1 to 4.

[Embodiment 6]

It is possible to apply the present invention to an active matrix EL display. An example of this is shown in FIG. 16.

Figure 16:
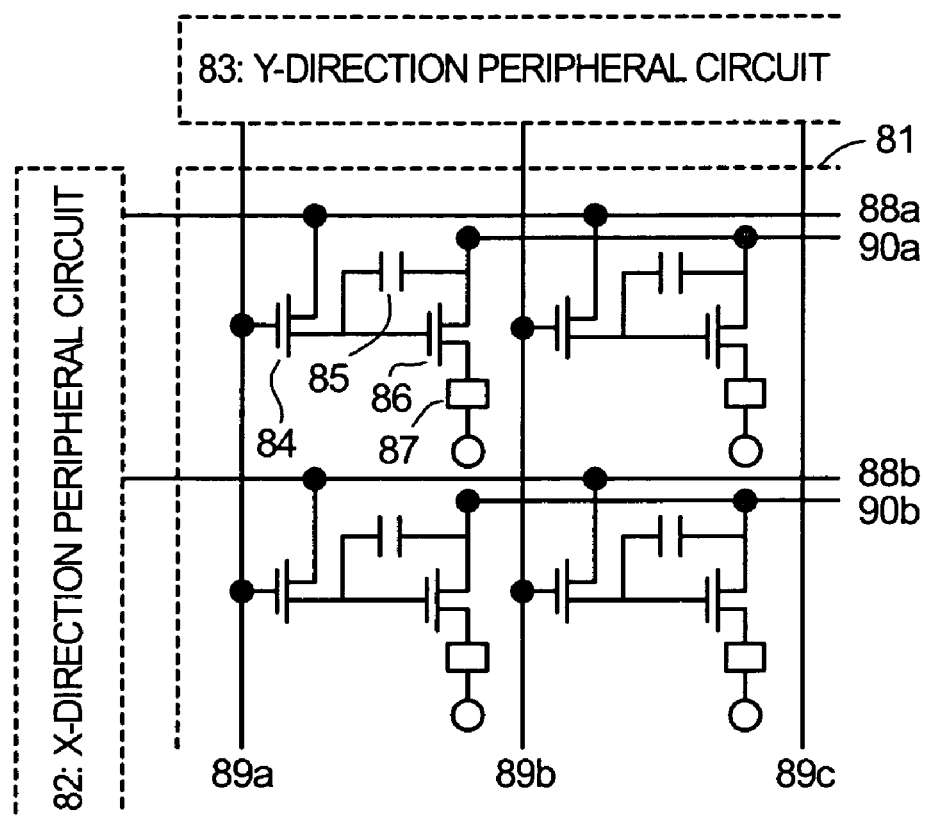
FIG. 16 is a diagram showing the structure of an active matrix type EL display device.

FIG. 16 is a circuit diagram of an active matrix EL display. Reference numeral 81 denotes a pixel circuit, and an x-direction driver circuit 82 and a y-direction driver circuit 83 are formed in its periphery. Further, each pixel in the pixel circuit 81 comprises a switching TFT 84, a capacitor 85, a current controlling TFT 86, and an organic EL element 87, and the switching TFT 84 is connected to x-direction signal lines 88*a* (or 88*b*) and to y-direction signal lines 89*a* (or 89*b*, 89*c*). Furthermore, power supply lines 90*a* and 90*b* are connected to the current controlling TFT 86.

In an active matrix EL display of the present embodiment, TFTs used in an x-direction driver circuit 82, a y-direction driver circuit 83 or current controlling TFT 86 are formed of combining p-channel TFT 200*a* or 202*a* of FIG. 12 and n-channel TFT 201*a* or 203*a* of FIG. 12. The TFTs for switching TFT 84 are formed by n-channel TFT 204 of FIG. 12.

It is possible to freely combine the active matrix EL display of this embodiment with any constitution of Embodiments 1 to 5.

[Embodiment 7]

The structure of the active matrix liquid crystal display device shown in FIG. 13 of the Embodiment 1 is described with reference to the perspective view of FIG. 17. The active matrix substrate (the first substrate) comprises a pixel portion 802, a gate side driver circuit 803 and a source side driver circuit 804 formed over a glass substrate 801. The pixel TFT 805 of the pixel portion (corresponding to pixel TFT 204 of FIG. 13) is an n-channel TFT, and is connected to a pixel electrode 806 and a storage capacitor 807 (corresponding to storage capacitor 205 of FIG. 13).

The driver circuits disposed in the periphery are comprised of CMOS circuits as their base. The gate side driver circuit 803 and the source side driver circuit 804 are connected to the pixel portion 802 through the gate wiring 808 and the source wiring 809 respectively. Further, input-output wiring (connecting wiring) 812 and 813 are disposed in the external input-output terminal 811 connected to the FPC 810 for transmitting signals to the driver circuits. Reference numeral 814 is an opposing substrate (the second substrate).

Figure 17:
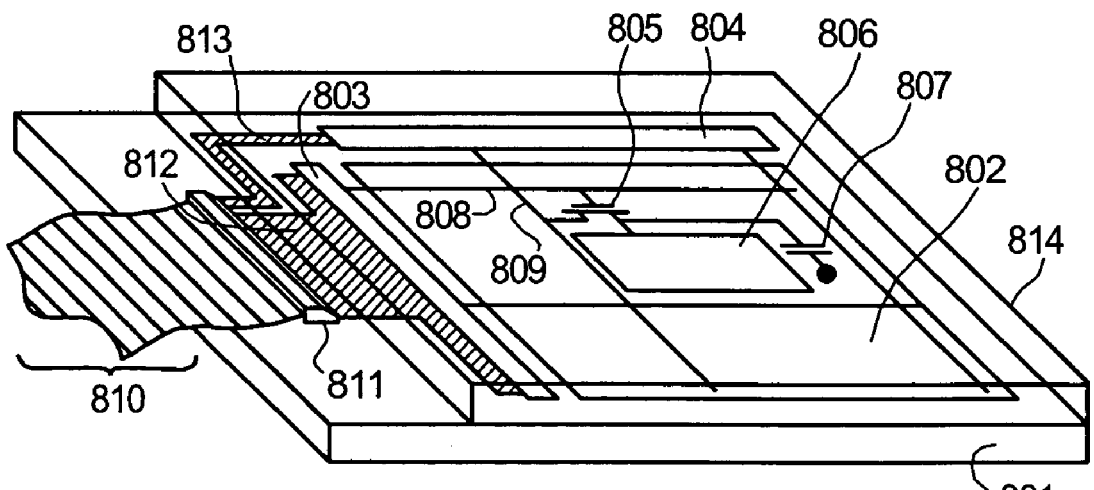
FIG. 17 is a diagram showing a perspective view of an AM-LCD.

Note that though the semiconductor device shown in FIG. 17 is referred to as active matrix liquid crystal display device in this Specification, the liquid crystal panel furnished with an FPC as shown in FIG. 17 is referred to as a liquid crystal module in general. Accordingly it is acceptable to refer an active matrix liquid crystal display device of this Embodiment as a liquid crystal module.

[Embodiment 8]

TFTs manufactured by implementing the present invention can be used for various electro-optical devices. Namely the present invention can be applied to all those electronic appliances that incorporate such an electro-optical device as the display medium.

Examples of the electronic appliances include a video camera, a digital camera, a head mounted display (a goggle type display), a wearable display, a car navigation system, a personal computer and a portable information terminal (a mobile computer, a cellular telephone, an electronic book). FIGS. 18A to 18F show examples of these.

Figure 18A:
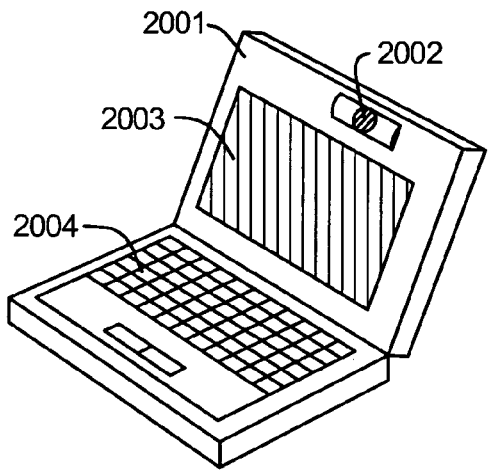
FIGS. 18A to 18F are diagrams showing examples of electronic equipment.

FIG. 18A shows a personal computer, which comprises: a main body 2001; an image input section 2002; a display section 2003; and a keyboard 2004. The present invention can be applied to the image input section 2002, the display section 2003 or other signal driver circuits.

Figure 18B:
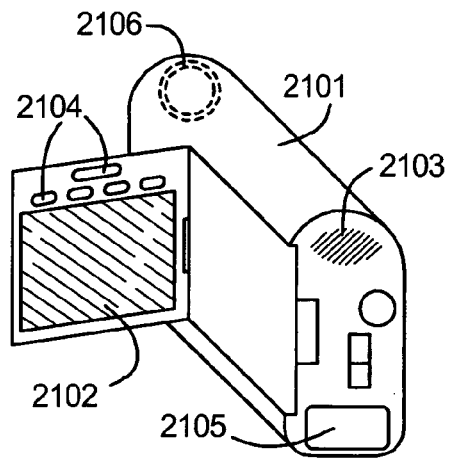

FIG. 18B shows a video camera, which comprises: a main body 2101; a display section 2102; a sound input section 2103; an operation switch 2104; a battery 2105; and an image receiving section 2106. The present invention can be applied to the display section 2102, the sound input section 2103 or other signal driver circuits.

Figure 18C:
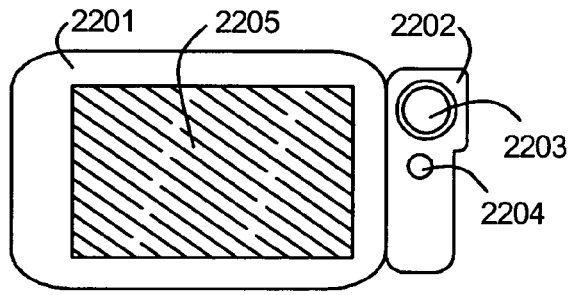

FIG. 18C shows a mobile computer, which comprises: a main body 2201; a camera section 2202; an image receiving section 2203; an operation switch 2204; and a display section 2205. The present invention can be applied to the display section 2205 or other signal driver circuits.

Figure 18D:
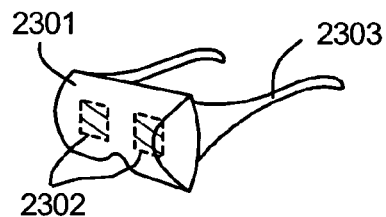

FIG. 18D shows a goggle type display, which comprises: a main body 2301; a display section 2302; and an arm section 2303. The present invention can be applied to the display section 2302 or other signal driver circuits.

Figure 18E:
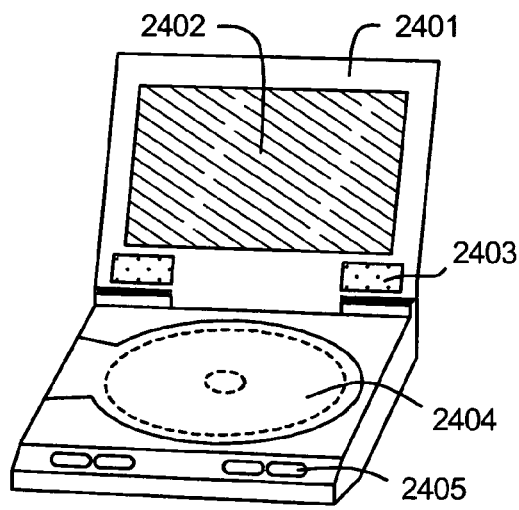

FIG. 18E shows a player that uses a recording medium storing a program (hereinafter called the "recording medium"). It comprises a main body 2401, a display section 2402, a speaker unit 2403, a recording medium 2404 and an operation switch 2405. Note that by using DVD (digital versatile disc), CD, etc., as a recording medium of this device, music appreciation, film appreciation, games or the use for Internet can be performed. The present invention can be applied to the display device 2402 and other signal driver circuits.

Figure 18F:
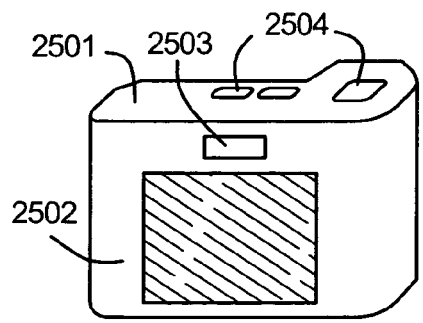

FIG. 18F shows a digital camera, which comprises: a main body 2501; a display section 2502; a view finder section 2503; an operation switch 2504; and an image reception unit (not shown). The present invention can be applied to the display section 2502 or other signal driver circuits.

As described above, the applicable range of the present invention is very large, and it can be applied to electronic appliances of various fields. Further, the electronic appliances of the present Embodiment can be realized by using constitution of any combination of Embodiments 1 to 7.

[Embodiment 9]

TFTs manufactured by implementing the present invention can be used for various electro-optical devices. Namely the present invention can be applied to all those electronic appliances that incorporate such an electro-optical device as the display medium.

Projectors (rear type or front type) or the like can be given as such electronic appliances. The examples are shown in FIGS. 19A to 19D.

Figure 19A:
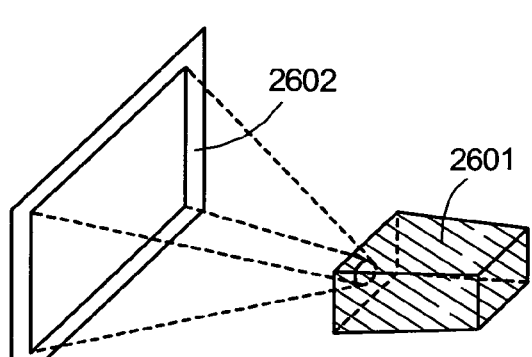
FIGS. 19A to 19D are diagrams showing examples of electronic equipment.

FIG. 19A shows a front type projector, which comprises: a display device 2601; and a screen 2602. The present invention can be applied to a liquid crystal display device 2808 which forms a part of the display device 2601, or other signal driver circuits.

Figure 19B:
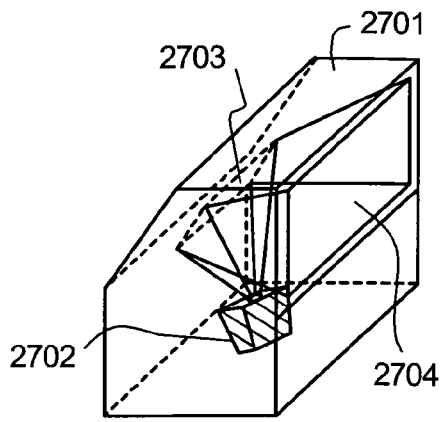

FIG. 19B shows a rear type projector, which comprises: a main body 2701; a display device 2702; a mirror 2703; and a screen 2704. The present invention can be applied to the liquid crystal display device 2808 that constitutes a part of the display device 2702, or other signal driver circuit.

Figure 19C:
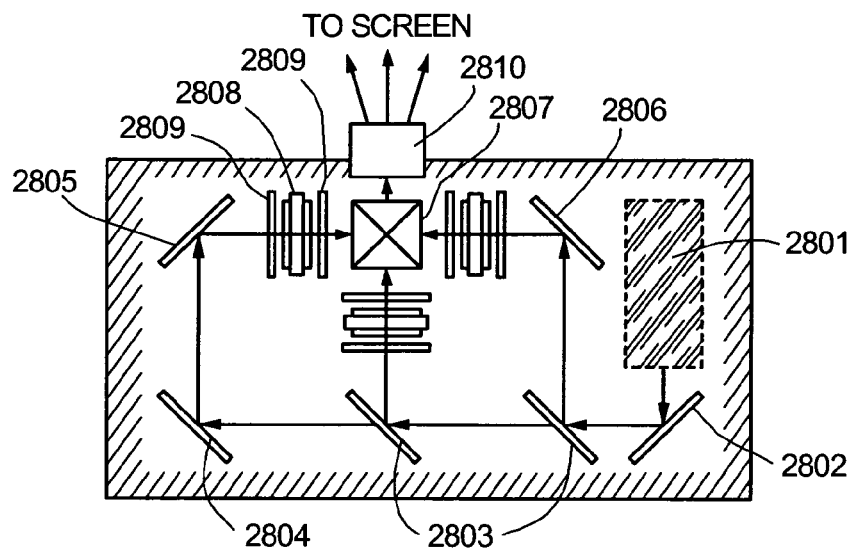

Note that FIG. 19C shows an example of the construction of the display devices 2601 and 2702 in FIGS. 19A and 19B. The projection systems 2601 and 2702 comprise: a light source optical system 2801; mirrors 2802, 2804 to 2806; a dichroic mirror 2803; a prism 2807; a liquid crystal display device 2808; a phase difference plate 2809; and a projection optical system 2810. The projection optical system 2810 comprises an optical system including a projection lens. Though the present Embodiment shows an example of the three-plate system, there is no limitation to such a system, and the present embodiment may be applied to a single-plate optical system. The operator may appropriately dispose an optical system such as an optical lens, a film having a polarization function, a film for adjusting the phase difference, an IR film, etc, in the optical path indicated by an arrow in FIG. 19C.

Figure 19D:
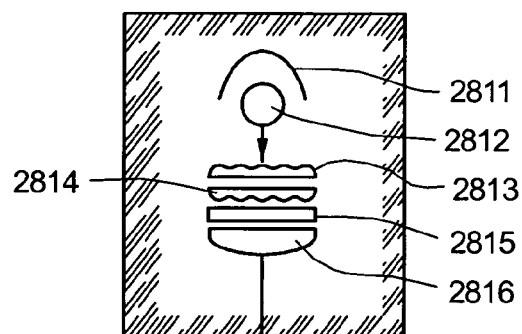

FIG. 19D shows an example of the structure of light source optical system 2801 in FIG. 19C. In this embodiment, the light source optical system 2801 comprises: a reflector 2811; a light source 2812; lens arrays 2813 and 2814; a polarization conversion element 2815; and a condenser lens 2816. Incidentally, the light source optical system shown in FIG. 19D is an example but is in no way restrictive. For example, the operator may appropriately dispose an optical system such as an optical lens, a film having a polarization function, a film for adjusting the phase difference, an IR film, etc, in the light source optical system.

As described above, the applicable range of the present invention is very large, and it can be applied to electronic appliances of various fields. Further, the electronic appliances of the present Embodiment can be realized by using constitution of any combination of Embodiments 1 to 3 and 7. Provided, however the projectors of the present Embodiment is a transmission type liquid crystal display device and it is needless to say that they cannot be applied to a reflection type liquid crystal display devices.

By suitably setting the conditions of bias power and specific gas flow rate, which are capable of controlling a taper angle α of a wiring, the selectivity with respect to a base film can be increased and at the same time, the desired taper angle α can be obtained in accordance with the present invention. As a result, the coverage of films formed on the wiring becomes better, and therefore, defects such as wiring chipping, wiring breakage, and short circuits can be reduced.

Further, etching can be performed with good distribution within the section, and a uniform wiring shape can be obtained.

Furthermore, the present invention can be applied to the opening processes of a contact hole etc.

What is claimed is:

1. A display device comprising:
   a substrate;
   a first N-channel thin film transistor formed over the substrate, the first N-channel thin film transistor comprising:
   a first semiconductor island including at least a first channel region, a second channel region, lightly doped regions, a capacitor forming region, and source and drain regions;
   a first gate insulating film formed over the first semiconductor island;
   a first gate electrode formed over the first channel region with the first gate insulating film interposed therebetween; and
   a second gate electrode formed over the second channel region with the first gate insulating film interposed therebetween;
   a driver circuit including at least one second N-channel type thin film transistor and a P-channel type thin film transistor formed over the substrate, the second N-channel type thin film transistor comprising:
   a second semiconductor island including at least a third channel region;
   a second gate insulating film formed over the second semiconductor island;
   a third gate electrode formed over the third channel region with the second gate insulating film interposed therebetween;
   a capacitor electrode formed over the capacitor forming region of the first semiconductor island with the first gate insulating film interposed therebetween;
   a protecting insulating film covering the first, second and third gate electrodes and the first and second semiconductor islands, the protecting insulating film comprising silicon nitride; and
   a pixel electrode formed over the protecting insulating film and electrically connected to one of the source and drain regions of the first semiconductor island,
   wherein each of the first, second and third gate electrodes has tapered edges with a taper angle of in a range of 20° to 70°,
   wherein each of the lightly doped regions is overlapped by the tapered edges of the first and second gate electrodes at least partly.

2. The display device according to claim 1, wherein each of the first, second and third gate electrodes comprises tungsten or an alloy thereof.

3. The display device according to claim 1, wherein each of the first, second and third gate electrodes comprises a material selected from the group consisting of Ta, Ti, Mo, Cr, Nb and Si.

4. The display device according to claim 1, wherein the pixel electrode comprises at least one of zinc oxide, indium oxide and zinc oxide alloy, and zinc oxide containing gallium.

5. The display device according to claim 1, wherein the taper angle is in a range of 25° to 35°.

6. The display device according to claim 1, further comprising a base film comprising silicon oxynitride film between the substrate and the first and second N-channel type thin film transistors.

7. The display device according to claim 1, wherein the gate insulating film comprises silicon oxynitride.

8. A display device comprising:
   a substrate;
   a first N-channel thin film transistor formed over the substrate, the first N-channel thin film transistor comprising:
   a first semiconductor island including at least a first channel region, a second channel region, and a capacitor forming region;
   a first gate insulating film formed over the first semiconductor island;
   a first gate electrode formed over the first channel region with the first gate insulating film interposed therebetween;
   a second gate electrode formed over the second channel region with the first gate insulating film interposed therebetween;
   a driver circuit including at least one second N-channel type thin film transistor and a P-channel type thin film transistor formed over the substrate, the second N-channel type thin film transistor comprising:
   a second semiconductor island including at least a third channel region;
   a second gate insulating film formed over the second semiconductor island;
   a third gate electrode formed over the third channel region with the second gate insulating film interposed therebetween;
   a capacitor electrode formed over the capacitor forming region of the first semiconductor island with the first gate insulating film interposed therebetween;
   a protecting insulating film covering the first, second and third gate electrodes and the first and second semiconductor islands, the protecting insulating film comprising silicon nitride; and
   a pixel electrode formed over the protecting insulating film and electrically connected to an impurity region of the first semiconductor island,
   wherein each of the first, second and third gate electrodes and the capacitor electrode has tapered edges with a taper angle of in a range of 20° to 70°.

9. The display device according to claim 8, wherein each of the first, second and third gate electrodes comprises tungsten or an alloy thereof.

10. The display device according to claim 8, wherein each of the first, second and third gate electrodes comprises a material selected from the group consisting of Ta, Ti, Mo, Cr, Nb and Si.

11. The display device according to claim 8, wherein the pixel electrode comprises at least one zinc oxide, indium oxide alloy, and zinc oxide containing gallium.

12. The display device according to claim 8, wherein the taper angle is in a range of 25° to 35°.

13. The display device according to claim 8, further comprising a base film comprising silicon oxynitride film between the substrate and the first and second N-channel type thin film transistors.

14. The display device according to claim 8, wherein the gate insulating film comprises silicon oxynitride.

15. A display device comprising:
a substrate;
a first N-channel thin film transistor formed over the substrate, the first N-channel thin film transistor comprising:
 a first semiconductor island including at least a first channel region, a second channel region, lightly doped regions, a capacitor forming region, and source and drain regions;
 a first gate insulating film formed over the first semiconductor island;
 a first gate electrode formed over the first channel region with the first gate insulating film interposed therebetween; and
 a second gate electrode formed over the second channel region with the first gate insulating film interposed therebetween;
a driver circuit including at least one second N-channel type thin film transistor and a P-channel type thin film transistor formed over the substrate, the second N-channel type thin film transistor comprising:
 a second semiconductor island including at least a third channel region;
 a second gate insulating film formed over the second semiconductor island;
 a third gate electrode formed over the third channel region with the second gate insulating film interposed therebetween;
a capacitor electrode formed over the capacitor forming region of the first semiconductor island with the first gate insulating film interposed therebetween;
a protecting insulating film covering the first, second and third gate electrodes and the first and second semiconductor islands, the protecting insulating film comprising silicon nitride; and
a pixel electrode formed over the protecting insulating film and electrically connected to one of the source and drain regions of the first semiconductor island,
wherein each of the first, second and third gate electrodes has tapered edges with a taper angle of in a range of 20° to 70°,
wherein each of the lightly doped regions is overlapped by the tapered edges of the first and second gate electrodes at least partly, and
wherein first portions of the first gate insulating film covered by the first and second gate electrodes are thicker than second portions of the first gate insulating film not covered by the first and second gate electrodes.

16. The display device according to claim 15, wherein each of the first, second and third gate electrodes comprises tungsten or an alloy thereof.

17. The display device according to claim 15, wherein each of the first, second and third gate electrodes comprises a material selected from the group consisting of Ta, Ti, Mo, Cr, Nb and Si.

18. The display device according to claim 15, wherein the pixel electrode comprises at least one of zinc oxide, indium oxide and zinc oxide alloy, and zinc oxide containing gallium.

19. The display device according to claim 15, wherein the taper angle is in a range of 25° to 35°.

20. The display device according to claim 15, further comprising a base film comprising silicon oxynitride film between the substrate and the first and second N-channel type thin film transistors.

21. The display device according to claim 15, wherein the gate insulating film comprises silicon oxynitride.

22. A display device comprising:
a substrate;
a first N-channel first thin film transistor formed over the substrate, the first N-channel thin film transistor comprising:
 a first semiconductor island including at least a first channel region, a second channel region, and a capacitor forming region;
 a first gate insulating film formed over the first semiconductor island;
 a first gate electrode formed over the first channel region with the first gate insulating film interposed therebetween;
 a second gate electrode formed over the second channel region with the first gate insulating film interposed therebetween;
a driver circuit including at least one second N-channel type thin film transistor and a P-channel type thin film transistor formed over the substrate, the second N-channel type thin film transistor comprising:
 a second semiconductor island including at least a third channel region;
 a second gate insulating film formed over the second semiconductor island;
 a third gate electrode formed over the third channel region with the second gate insulating film interposed therebetween;
a capacitor electrode formed over the capacitor forming region of the first semiconductor island with the first gate insulating film interposed therebetween;
a protecting insulating film covering the first, second and third gate electrodes and the first and second semiconductor islands, the protecting insulating film comprising silicon nitride;
a pixel electrode formed over the protecting insulating film and electrically connected to an impurity region of the first semiconductor island,
wherein each of the first, second and third gate electrodes and the capacitor electrode has tapered edges with a taper angle of in a range of 20° to 70°, and
wherein first portions of the first gate insulating film covered by the first and second gate electrodes are thicker than second portions of the first gate insulating film not covered by the first and second gate electrodes.

23. The display device according to claim 22, wherein each of the first, second and third gate electrodes comprises tungsten or an alloy thereof.

24. The display device according to claim 22, wherein each of the first, second and third gate electrodes comprises a material selected from the group consisting of Ta, Ti, Mo, Cr, Nb and Si.

25. The display device according to claim 22, wherein the pixel electrode comprises at least one of zinc oxide, indium oxide and zinc oxide alloy, and zinc oxide containing gallium.

26. The display device according to claim 22, wherein the taper angle is in a range of 25° to 35°.

27. The display device according to claim 22, further comprising a base film comprising silicon oxynitride film between the substrate and the first and second N-channel type thin film transistors.

28. The display device according to claim 22, wherein the gate insulating film comprises silicon oxynitride.

29. A display device comprising:
a substrate;
a first N-channel first thin film transistor formed over the substrate, the first N-channel thin film transistor comprising:

a first semiconductor island including at least a first channel region, a second channel region, lightly doped regions, a capacitor forming region, and source and drain regions;

a first gate insulating film formed over the first semiconductor island;

a first gate electrode formed over the first channel region with the first gate insulating film interposed therebetween; and a second gate electrode formed over the second channel region with the first gate insulating film interposed therebetween;

a driver circuit including at least one second N-channel type thin film transistor and a P-channel type thin film transistor formed over the substrate, the second N-channel type thin film transistor comprising:

a second semiconductor island including at least a third channel region;

a second gate insulating film formed over the second semiconductor island;

a third gate electrode formed over the third channel region with the second gate insulating film interposed therebetween;

a capacitor electrode formed over the capacitor forming region of the first semiconductor island with the first gate insulating film interposed therebetween;

a protecting insulating film covering the first, second and third gate electrodes and the first and second semiconductor islands, the protecting insulating film comprising silicon nitride;

an interlayer insulating film comprising an organic resin formed over the protecting insulating film; and a pixel electrode formed over the interlayer insulating film and electrically connected to one of the source and drain regions of the first semiconductor island, wherein each of the first, second and third gate electrodes has tapered edges with a taper angle of in a range of 20° to 70°, and wherein each of the lightly doped regions is overlapped by the tapered edges of the first and second gate electrodes at least partly.

30. The display device according to claim 29, wherein each of the first, second and third gate electrodes comprises tungsten or an alloy thereof.

31. The display device according to claim 29, wherein each of the first, second and third gate electrodes comprises a material selected from the group consisting of Ta, Ti, Mo, Cr, Nb and Si.

32. The display device according to claim 29, wherein the pixel electrode comprises at least one of zinc oxide, indium oxide and zinc oxide alloy, and zinc oxide containing gallium.

33. The display device according to claim 29, wherein the taper angle is in a range of 25° to 35°.

34. The display device according to claim 29, further comprising a base film comprising silicon oxynitride film between the substrate and the first and second N-channel type thin film transistors.

35. The display device according to claim 29, wherein the gate insulating film comprises silicon oxynitride.

36. The display device according to claim 29, wherein the organic resin comprises a material selected from the group consisting of polyimide, acrylic, polyamide, polyimide amide and BCB.

37. A display device comprising:

a substrate;

a first N-channel first thin film transistor formed over the substrate, the first N-channel thin film transistor comprising:

a first semiconductor island including at least a first channel region, a second channel region, and a capacitor forming region;

a first gate insulating film formed over the first semiconductor island;

a first gate electrode formed over the first channel region with the first gate insulating film interposed therebetween;

a second gate electrode formed over the second channel region with the first gate insulating film interposed therebetween;

a driver circuit including at least one second N-channel type thin film transistor and a P-channel type thin film transistor formed over the substrate, the second N-channel type thin film transistor comprising:

a second semiconductor island including at least a third channel region;

a second gate insulating film formed over the second semiconductor island;

a third gate electrode formed over the third channel region with the second gate insulating film interposed therebetween;

a capacitor electrode formed over the capacitor forming region of the first semiconductor island with the first gate insulating film interposed therebetween;

a protecting insulating film covering the first, second and third gate electrodes and the first and second semiconductor islands, the protecting insulating film comprising silicon nitride;

an interlayer insulating film comprising an organic resin formed over the protecting insulating film; and a pixel electrode formed over the interlayer insulating film and electrically connected to an impurity region of the first semiconductor island, wherein each of the first, second and third gate electrodes and the capacitor electrode has tapered edges with a taper angle of in a range of 20° to 70°.

38. The display device according to claim 37, wherein each of the first, second and third gate electrodes comprises tungsten or an alloy thereof.

39. The display device according to claim 37, wherein each of the first, second and third gate electrodes comprises a material selected from the group consisting of Ta, Ti, Mo, Cr, Nb and Si.

40. The display device according to claim 37, wherein the pixel electrode comprises at least one of zinc oxide, indium oxide and zinc oxide alloy, and zinc oxide containing gallium.

41. The display device according to claim 37, wherein the taper angle is in a range of 25° to 35°.

42. The display device according to claim 37, further comprising a base film comprising silicon oxynitride film between the substrate and the first and second N-channel type thin film transistors.

43. The display device according to claim 37, wherein the gate insulating film comprises silicon oxynitride.

44. The display device according to claim 37, wherein the organic resin comprises a material selected from the group consisting of polyimide, acrylic, polyamide, polyimide amide and BCB.

45. A display device comprising:
a substrate;
a first N-channel first thin film transistor formed over the substrate, the first N-channel thin film transistor comprising:
a first semiconductor island including at least a first channel region, a second channel region, lightly doped regions, a capacitor forming region, and source and drain regions;
a first gate insulating film formed over the first semiconductor island;
a first gate electrode formed over the first channel region with the first gate insulating film interposed therebetween; and
a second gate electrode formed over the second channel region with the first gate insulating film interposed therebetween;
a driver circuit including at least one second N-channel type thin film transistor and a P-channel type thin film transistor formed over the substrate, the second N-channel type thin film transistor comprising:
a second semiconductor island including at least a third channel region;
a second gate insulating film formed over the second semiconductor island;
a third gate electrode formed over the third channel region with the second gate insulating film interposed therebetween;
a capacitor electrode formed over the capacitor forming region of the first semiconductor island with the first gate insulating film interposed therebetween;
a protecting insulating film covering the first, second and third gate electrodes and the first and second semiconductor islands, the protecting insulating film comprising silicon nitride;
an interlayer insulating film comprising an organic resin formed over the protecting insulating film; and
a pixel electrode formed over the interlayer insulating film and electrically connected to one of the source and drain regions of the first semiconductor island,
wherein each of the first, second and third gate electrodes has tapered edges with a taper angle of in a range of 20° to 70°,
wherein each of the lightly doped regions is overlapped by the tapered edges of the first and second gate electrodes at least partly, and
wherein first portions of the first gate insulating film covered by the first and second gate electrodes are thicker than second portions of the first gate insulating film not covered by the first and second gate electrodes.

46. The display device according to claim 45, wherein each of the first, second and third gate electrodes comprises tungsten or an alloy thereof.

47. The display device according to claim 45, wherein each of the first, second and third gate electrodes comprises a material selected from the group consisting of Ta, Ti, Mo, Cr, Nb and Si.

48. The display device according to claim 45, wherein the pixel electrode comprises at least one of zinc oxide, indium oxide and zinc oxide alloy, and zinc oxide containing gallium.

49. The display device according to claim 45, wherein the taper angle is in a range of 25° to 35°.

50. The display device according to claim 45, further comprising a base film comprising silicon oxynitride film between the substrate and the first and second N-channel type thin film transistors.

51. The display device according to claim 45, wherein the gate insulating film comprises silicon oxynitride.

52. The display device according to claim 45, wherein the organic resin comprises a material selected from the group consisting of polyimide, acrylic, polyamide, polyimide amide and BCB.

53. A display device comprising:
a substrate;
a first N-channel first thin film transistor formed over the substrate, the first N-channel thin film transistor comprising:
a first semiconductor island including at least a first channel region, a second channel region, and a capacitor forming region;
a first gate insulating film formed over the first semiconductor island;
a first gate electrode formed over the first channel region with the first gate insulating film interposed therebetween;
a second gate electrode formed over the second channel region with the first gate insulating film interposed therebetween;
a driver circuit including at least one second N-channel type thin film transistor and a P-channel type thin film transistor formed over the substrate, the second N-channel type thin film transistor comprising:
a second semiconductor island including at least a third channel region;
a second gate insulating film formed over the second semiconductor island;
a third gate electrode formed over the third channel region with the second gate insulating film interposed therebetween;
a capacitor electrode formed over the capacitor forming region of the first semiconductor island with the first gate insulating film interposed therebetween;
a protecting insulating film covering the first, second and third gate electrodes and thte first and second semiconductor islands, the protecting insulating film comprising silicon nitride;
an interlayer insulating film comprising an organic resin formed over the protecting insulating film; and
a pixel electrode formed over the interlayer insulating film and electrically connected to an impurity region of the first semiconductor island,
wherein each of the first, second and third gate electrodes and the capacitor electrode has tapered edges with a taper angle of in a range of 20° to 70°, and
wherein first portions of the first gate insulating film covered by the first and second gate electrodes are thicker than second portions of the first gate insulating film not covered by the first and second gate electrodes.

54. The display device according to claim 53, wherein each of the first, second and third gate electrodes comprises tungsten or an alloy thereof.

55. The display device according to claim 53, wherein each of the first, second and third gate electrodes comprises a material selected from the group consisting of Ta, Ti, Mo, Cr, Nb and Si.

56. The display device according to claim 53, wherein the pixel electrode comprises at least one of zinc oxide, indium oxide and zinc oxide alloy, and zinc oxide containing gallium.

57. The display device according to claim 53, wherein the taper angle is in a range of 25° to 35°.

58. The display device according to claim 53, further comprising a base film comprising silicon oxynitride film between the substrate and the first and second N-channel type thin film transistors.

59. The display device according to claim 53, wherein the gate insulating film comprises silicon oxynitride.

60. The display device according to claim 53, wherein the organic resin comprises a material selected from the group consisting of polyimide, acrylic, polyamide, polyimide amide and BCB.

61. The display device according to claim 1, further comprising a light shielding film overlapping the first semiconductor island.

62. The display device according to claim 8, further comprising a light shielding film overlapping the first semiconductor island.

63. The display device according to claim 15, further comprising a light shielding film overlapping the first semiconductor island.

64. The display device according to claim 22, further comprising a light shielding film overlapping the first semiconductor island.

65. The display device according to claim 29, further comprising a light shielding film overlapping the first semiconductor island.

66. The display device according to claim 37, further comprising a light shielding film overlapping the first semiconductor island.

67. The display device according to claim 45, further comprising a light shielding film overlapping the first semiconductor island.

68. The display device according to claim 53, further comprising a light shielding film overlapping the first semiconductor island.

69. The display device according to claim 1, wherein the display device is incorporated in one selected from the group consisting of a computer, a camera, a goggle type display, a player that uses a recording medium, and a projector.

70. The display device according to claim 8, wherein the display device is incorporated in one selected from the group consisting of a computer, a camera, a goggle type display, a player that uses a recording medium, and a projector.

71. The display device according to claim 15, wherein the display device is incorporated in one selected from the group consisting of a computer, a camera, a goggle type display, a player that uses a recording medium, and a projector.

72. The display device according to claim 22, wherein the display device is incorporated in one selected from the group consisting of a computer, a camera, a goggle type display, a player that uses a recording medium, and a projector.

73. The display device according to claim 29, wherein the display device is incorporated in one selected from the group consisting of a computer, a camera, a goggle type display, a player that uses a recording medium, and a projector.

74. The display device according to claim 37, wherein the display device is incorporated in one selected from the group consisting of a computer, a camera, a goggle type display, a player that uses a recording medium, and a projector.

75. The display device according to claim 45, wherein the display device is incorporated in one selected from the group consisting of a computer, a camera, a goggle type display, a player that uses a recording medium, and a projector.

76. The display device according to claim 53, wherein the display device is incorporated in one selected from the group consisting of a computer, a camera, a goggle type display, a player that uses a recording medium, and a projector.

* * * * *